(12) United States Patent
Degen et al.

(10) Patent No.: US 10,305,239 B2
(45) Date of Patent: May 28, 2019

(54) PANE COMPRISING AN ELECTRICAL CONNECTION ELEMENT

(75) Inventors: Christoph Degen, Toenisvorst (DE);
Bernhard Reul, Herzogenrath (DE);
Mitja Rateiczak, Wuerselen (DE);
Andreas Schlarb, Wuppertal (DE);
Lothar Lesmeister, Landgraaf (NL)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 324 days.

(21) Appl. No.: 14/115,839

(22) PCT Filed: Apr. 17, 2012

(86) PCT No.: PCT/EP2012/056965
§ 371 (c)(1),
(2), (4) Date: Feb. 21, 2014

(87) PCT Pub. No.: WO2012/152544
PCT Pub. Date: Nov. 15, 2012

(65) Prior Publication Data
US 2014/0170913 A1    Jun. 19, 2014

(30) Foreign Application Priority Data

May 10, 2011  (EP) .................................. 11165504
May 10, 2011  (EP) .................................. 11165506

(51) Int. Cl.
*H01R 13/02*    (2006.01)
*H01R 43/02*    (2006.01)
(Continued)

(52) U.S. Cl.
CPC ......... *H01R 43/0235* (2013.01); *B23K 1/002* (2013.01); *B23K 1/0004* (2013.01);
(Continued)

(58) Field of Classification Search
CPC . H05B 3/84; H01R 4/02; H01R 4/023; H01R 4/062; H01R 13/02; H01R 13/03;
(Continued)

(56) References Cited

U.S. PATENT DOCUMENTS 2,062,335 A    12/1936  Scott
2,481,385 A *  9/1949  Bloom ............... B23K 35/3086
                                                  420/43
(Continued)

FOREIGN PATENT DOCUMENTS

CN    200944682 Y    9/2007
CN    101244686 A    8/2008
(Continued)

OTHER PUBLICATIONS

Restriction Requirement for U.S. Appl. No. 14/115,091, filed Feb. 10, 2014 on behalf of Harald Cholewa. dated Sep. 9, 2015. 10 pages.
(Continued)

*Primary Examiner* — Steven T Sawyer
*Assistant Examiner* — Paresh H Paghadal
(74) *Attorney, Agent, or Firm* — Steinfl + Bruno LLP

(57) ABSTRACT

A pane provided with at least one electrical connection element is described. The pane has a substrate, an electroconductive structure on a region of the substrate, a layer of soldering mass on a region of the electroconductive structure, and a connection element on the solder mass. The connection element contains a first and a second base region, a first and a second transition region, and a bridge region between the first and the second transition region, a first and a second contact surface arranged on a lower side of the first and second base regions. The first and the second contact surfaces and surfaces of the first and the second transition regions, facing the substrate are connected to the electroconductive structure by the solder mass. An angle between
(Continued)

Figure 1:
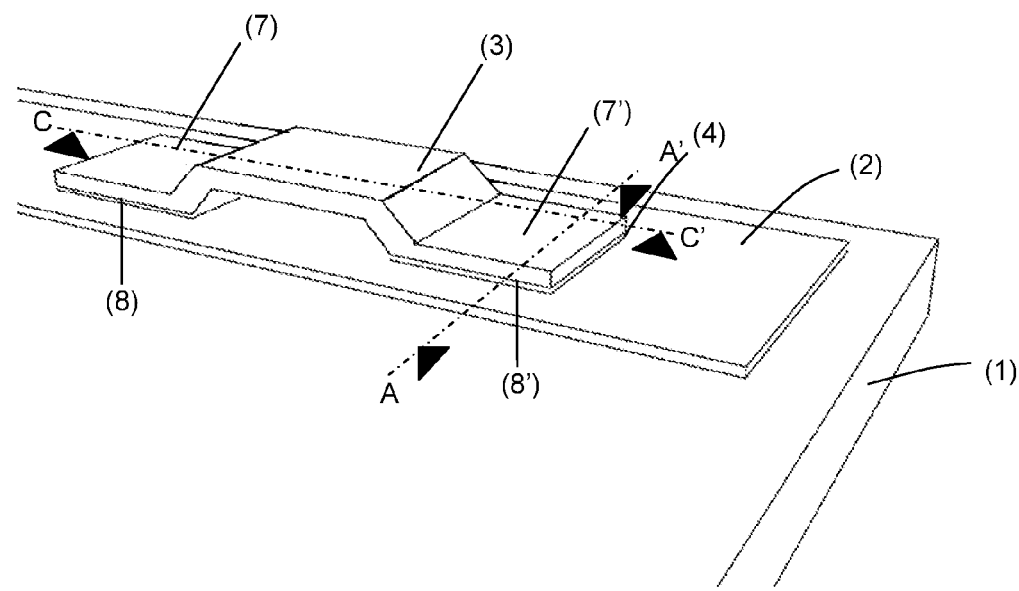

a surface of the substrate and each tangential plane of the surfaces of the first and the second transition region, facing the substrate, is less than 90°.

20 Claims, 9 Drawing Sheets

(51) Int. Cl.
| | |
|---|---|
| *H05B 3/84* | (2006.01) |
| *H01R 13/03* | (2006.01) |
| *B23K 1/00* | (2006.01) |
| *B23K 1/002* | (2006.01) |
| *B23K 1/005* | (2006.01) |
| *B23K 1/012* | (2006.01) |
| *B23K 1/06* | (2006.01) |
| *B23K 33/00* | (2006.01) |
| *H05K 1/09* | (2006.01) |
| *H05K 1/11* | (2006.01) |
| *H01R 4/02* | (2006.01) |
| *B23K 101/00* | (2006.01) |
| *B23K 101/38* | (2006.01) |
| *B23K 103/04* | (2006.01) |
| *B23K 103/12* | (2006.01) |
| *H01R 12/57* | (2011.01) |
| *H01R 101/00* | (2006.01) |

(52) U.S. Cl.
CPC ............ *B23K 1/0056* (2013.01); *B23K 1/012* (2013.01); *B23K 1/06* (2013.01); *B23K 33/00* (2013.01); *H01R 13/03* (2013.01); *H05B 3/84* (2013.01); *B23K 2101/006* (2018.08); *B23K 2101/38* (2018.08); *B23K 2103/05* (2018.08); *B23K 2103/12* (2018.08); *H01R 4/02* (2013.01); *H01R 4/023* (2013.01); *H01R 4/029* (2013.01); *H01R 12/57* (2013.01); *H01R 43/0207* (2013.01); *H01R 43/0242* (2013.01); *H01R 2101/00* (2013.01); *H05B 2203/016* (2013.01); *H05K 1/09* (2013.01); *H05K 1/11* (2013.01); *Y10T 29/49213* (2015.01)

(58) Field of Classification Search
CPC .. H01R 43/0235; H01R 3/84; H01R 2101/00; H01R 43/0207; H01R 43/0242; H01R 4/029; B23K 2203/04; B23K 2203/012; B23K 2201/006; B23K 2201/38; B23K 1/002; B23K 33/00; B23K 1/06; B23K 1/012; B23K 1/0056; B23K 1/0004; B23K 2203/05; B23K 2203/12; Y10T 29/49213; H05K 1/09; H05K 1/11
See application file for complete search history.

(56) References Cited

U.S. PATENT DOCUMENTS

| | | | | |
|---|---|---|---|---|
| 2,644,066 | A | * | 6/1953 | Glynn .................. H05B 3/84 29/517 |
| 2,672,414 | A | | 3/1954 | Phillips et al. |
| 2,709,211 | A | | 5/1955 | Glynn |
| 2,736,649 | A | | 2/1956 | Phillips |
| 3,088,833 | A | | 5/1963 | Pirooz |
| 3,204,326 | A | | 9/1965 | Granitsas |
| 3,484,584 | A | | 12/1969 | Shaw |
| 3,534,148 | A | | 10/1970 | Bange |
| 3,746,536 | A | | 7/1973 | Kuse |
| 3,746,586 | A | * | 7/1973 | Buchanan ............... C22C 38/28 148/326 |
| 3,880,369 | A | * | 4/1975 | Kunstovny ......... B02C 13/2804 241/300 |
| 4,023,008 | A | * | 5/1977 | Durussel .................. H05B 3/84 219/203 |
| 4,179,285 | A | | 12/1979 | Tanczyn |
| 4,246,467 | A | * | 1/1981 | Boaz ........................ H05B 3/84 174/94 R |
| 4,321,296 | A | | 3/1982 | Rougier |
| 4,403,307 | A | | 9/1983 | Maeda |
| 4,498,096 | A | | 2/1985 | Addie et al. |
| 4,908,548 | A | * | 3/1990 | Mizohata ................. H01J 31/15 313/497 |
| 5,596,335 | A | | 1/1997 | Dishart et al. |
| 5,738,554 | A | | 4/1998 | Borger et al. |
| 5,961,737 | A | | 10/1999 | Glenn |
| 6,284,985 | B1 | | 9/2001 | Naba et al. |
| 6,396,026 | B2 | | 5/2002 | Gillner et al. |
| 6,406,337 | B1 | | 6/2002 | Machado |
| 6,638,120 | B2 | | 10/2003 | Costa |
| 6,685,514 | B2 | | 2/2004 | Costa |
| 6,787,700 | B2 | | 9/2004 | Nagao et al. |
| 6,790,104 | B2 | | 9/2004 | Antaya et al. |
| 6,816,385 | B1 | | 11/2004 | Alcoe |
| 7,134,201 | B2 | | 11/2006 | Ackerman et al. |
| 7,514,654 | B2 | * | 4/2009 | Okajima ............... B23K 1/0008 219/202 |
| 7,675,004 | B2 | | 3/2010 | Nakajima et al. |
| 7,909,665 | B2 | | 3/2011 | Lyon |
| 7,974,104 | B2 | | 7/2011 | Kitada et al. |
| 8,816,214 | B2 | | 8/2014 | Ziegler et al. |
| 8,816,215 | B2 | | 8/2014 | Reul et al. |
| 8,905,778 | B2 | | 12/2014 | Jenrich et al. |
| 9,385,437 | B2 | | 7/2016 | Cholewa et al. |
| D815,042 | S | | 4/2018 | Jenrich |
| 2002/0001997 | A1 | | 1/2002 | Reul |
| 2002/0102886 | A1 | | 8/2002 | Costa |
| 2002/0111081 | A1 | | 8/2002 | Machado |
| 2003/0030064 | A1 | * | 2/2003 | Takano ..................... G02B 7/008 257/98 |
| 2003/0073349 | A1 | | 4/2003 | Nagao et al. |
| 2003/0180545 | A1 | | 9/2003 | Capriotti et al. |
| 2005/0029666 | A1 | | 2/2005 | Kurihara et al. |
| 2005/0112291 | A1 | | 5/2005 | Okajima et al. |
| 2006/0228953 | A1 | | 10/2006 | Pereira et al. |
| 2006/0240265 | A1 | * | 10/2006 | Cook .................... B23K 35/262 428/426 |
| 2007/0030064 | A1 | | 2/2007 | Yu |
| 2007/0031279 | A1 | | 2/2007 | Soga et al. |
| 2007/0105412 | A1 | | 5/2007 | Hoepfner et al. |
| 2007/0224842 | A1 | * | 9/2007 | Hoepfner ................ H01R 4/02 439/34 |
| 2008/0164248 | A1 | * | 7/2008 | Reul ...................... B23K 1/002 219/617 |
| 2008/0230269 | A1 | | 9/2008 | Susai et al. |
| 2008/0280503 | A1 | | 11/2008 | Van Der Meulen et al. |
| 2009/0044464 | A1 | | 2/2009 | Schmidt et al. |
| 2009/0272577 | A1 | * | 11/2009 | Shiomi ................... H01L 24/40 174/4 R |
| 2009/0277671 | A1 | | 11/2009 | Hahn |
| 2010/0285685 | A1 | * | 11/2010 | Ziegler .................... H05B 3/84 439/382 |
| 2010/0295187 | A1 | | 11/2010 | Tsuruoka et al. |
| 2010/0321798 | A1 | | 12/2010 | Chen et al. |
| 2011/0056589 | A1 | | 3/2011 | De Boer et al. |
| 2011/0056747 | A1 | | 3/2011 | Matsushita et al. |
| 2012/0060559 | A1 | | 3/2012 | Boussaad et al. |
| 2012/0298416 | A1 | | 11/2012 | Ziegler et al. |
| 2012/0305311 | A1 | | 12/2012 | Jenrich |
| 2012/0318566 | A1 | | 12/2012 | Reul et al. |
| 2013/0043066 | A1 | | 2/2013 | Cholewa et al. |
| 2013/0045647 | A1 | | 2/2013 | Jenrich et al. |
| 2014/0110166 | A1 | | 4/2014 | Degen et al. |
| 2014/0158424 | A1 | | 6/2014 | Schlarb et al. |
| 2014/0182932 | A1 | | 7/2014 | Cholewa et al. |
| 2014/0301892 | A1 | | 10/2014 | Maekawa et al. |
| 2015/0179539 | A1 | | 6/2015 | Tamai |

(56) References Cited

U.S. PATENT DOCUMENTS

| | | |
|---|---|---|
| 2015/0236431 A1 | 8/2015 | Schmalbuch et al. |
| 2016/0309588 A1 | 10/2016 | Cholewa et al. |

FOREIGN PATENT DOCUMENTS

| | | | | |
|---|---|---|---|---|
| DE | 1936780 A1 | 2/1970 | | |
| DE | 102010018860 A1 | 11/2001 | | |
| DE | 10046489 C1 | 12/2001 | | |
| DE | 20203202 U1 | 6/2002 | | |
| DE | 102006017675 | 10/2007 | | |
| DE | 202008015441 | 4/2010 | | |
| DE | 102009016353 | 10/2010 | | |
| DE | 202011100906 U1 | 6/2011 | | |
| EA | 201290855 A1 | 2/2013 | | |
| EP | 0023121 | 1/1981 | | |
| EP | 488878 A1 | 6/1992 | | |
| EP | 0488878 A1 * | 6/1992 | ............... | H05B 3/84 |
| EP | 0720253 | 7/1996 | | |
| EP | 0848449 A1 | 6/1998 | | |
| EP | 1488972 | 12/2004 | | |
| EP | 1942703 | 7/2008 | | |
| EP | 2299544 A1 | 3/2011 | | |
| EP | 2365730 A1 | 9/2011 | | |
| EP | 2367399 A1 | 9/2011 | | |
| EP | 2408260 A1 | 1/2012 | | |
| FR | 1104595 A | 11/1955 | | |
| GB | 751536 A | 6/1956 | | |
| GB | 1163224 | 9/1969 | | |
| JP | S5678170 A | 6/1981 | | |
| JP | S60208076 A * | 4/1984 | ............... | H05B 3/04 |
| JP | S60208076 A | 10/1985 | | |
| JP | S60212987 * | 10/1985 | ............... | H05B 3/04 |
| JP | S60212987 A | 10/1985 | | |
| JP | H0696847 A | 4/1994 | | |
| JP | H0658557 U | 8/1994 | | |
| JP | H08246105 A | 9/1996 | | |
| JP | H09139565 A | 5/1997 | | |
| JP | H09226522 A | 5/1997 | | |
| JP | H10163355 A | 6/1998 | | |
| JP | 2908922 B2 | 6/1999 | | |
| JP | H11306862 A | 11/1999 | | |
| JP | H11347785 A | 12/1999 | | |
| JP | 2001126648 A * | 5/2001 | ............... | H01J 31/15 |
| JP | 2003521093 A | 7/2003 | | |
| JP | 3957302 B2 | 8/2007 | | |
| JP | 2007335260 A | 12/2007 | | |
| JP | 2008218399 A | 9/2008 | | |
| JP | 20100108854 A | 5/2010 | | |
| JP | 2010527120 A | 8/2010 | | |
| JP | 2001126648 A | 5/2011 | | |
| KR | 20080063712 A | 7/2008 | | |
| MX | 2013015237 A | 2/2014 | | |
| WO | 98/47200 A1 | 10/1998 | | |
| WO | 2004012302 A1 | 2/2004 | | |
| WO | 2004/068643 | 8/2004 | | |
| WO | 2006098160 A1 | 9/2006 | | |
| WO | 2006132319 A1 | 12/2006 | | |
| WO | 2007/110610 | 10/2007 | | |
| WO | 2009135469 A1 | 11/2009 | | |
| WO | 2012152543 A1 | 11/2012 | | |
| WO | 2013004434 A1 | 1/2013 | | |

OTHER PUBLICATIONS

Non-Final Office Action for U.S. Appl. No. 14/115,091, filed Feb. 10, 2014 on behalf of Harald Cholewa. dated Jan. 20, 2016. 22 pages.
Written Opinion for PCT Application No. PCT/EP2012/056964 filed Apr. 17, 2012 on behalf of Saint-Gobain Glass France. dated Jun. 14, 2012. 16 pages (German original + English translation).
Written Opinion for PCT Application No. PCT/EP2012/056963 filed Apr. 17, 2012 on behalf of Saint-Gobain Glass France. dated Jun. 1, 2012. 12 pages (German original + English translation).
PCT International Preliminary Report on Patentability dated Nov. 12, 2013 for PCT/EP2012/056965 filed on Apr. 17, 2012 in the name of Saint-Gobain Glass France (English Translation + German Original).
PCT International Preliminary Report on Patentability dated Nov. 12, 2013 for PCT/EP2012/056964 filed on Apr. 17, 2012 in the name of Saint-Gobain Glass France (English Translation + German Original).
PCT International Preliminary Report on Patentability dated Nov. 12, 2013 for PCT/EP2012/056963 filed on Apr. 17, 2012 in the name of Saint-Gobain Glass France (English Translation + German Original).
PCT International Search Report dated Jun. 14, 2012 for PCT/EP2012/056964 filed on Apr. 17, 2012 in the name of Saint-Gobain Glass France (English translation and German original).
PCT International Search Report dated Jun. 8, 2012 for PCT/EP2012/056965 filed on Apr. 17, 2012 in the name of Saint-Gobain Glass France (English translation and German original).
PCT International Search Report dated Jun. 1, 2012 for PCT/EP2012/056963 filed on Apr. 17, 2012 in the name of Saint-Gobain Glass France (English translation and German original).
Final Office Action for U.S. Appl. No. 14/115,844, filed Dec. 18, 2013 on behalf of Christoph Degen et al. dated Jun. 27, 2017. 17 pages.
Non-Final Office Action for U.S. Appl. No. 14/115,091, filed Feb. 10, 2014 on behalf of Harald Cholewa et al. dated May 24, 2017. 19 pages.
PCT Written Opinion for PCT/EP2013/064576 filed Jul. 10, 2013 on behalf of Saint-Gobain Glass France. dated Oct. 22, 2013. 16 paged German original + English translation.
PCT Written Opinion for PCT/EP2013/064575 filed Jul. 10, 2013 on behalf of Saint-Gobain Glass France. dated Oct. 17, 2013. 16 pages German original + English translation.
PCT International Search Report for PCT/EP2013/064576 filed Jul. 10, 2013 on behalf of Saint-Gobain Glass France. dated Oct. 22, 2013. 2 pages.
PCT International Search Report for PCT/EP2013/064575 filed Jul. 10, 2013 on behalf of Saint-Gobain Glass France. dated Oct. 17, 2013. 7 pages German original + English translation.
Final Office Action for U.S. Appl. No. 14/115,091, filed Feb. 10, 2014 on behalf of Harald Cholewa. dated Jun. 14, 2016. 15 pages.
Restriction Requirement for U.S. Appl. No. 14/115,844, filed Dec. 18, 2013 on behalf of Christoph Degen. dated Jun. 29, 2016. 6 pages.
Final Office Action for U.S. Appl. No. 14/115,091, filed Feb. 10, 2014 on behalf of Harald Cholewa. dated Nov. 14, 2017. 21 pages.
Non-Final Office Action for U.S. Appl. No. 14/115,844, filed Dec. 18, 2013 on behalf of Christoph Degen. dated Jan. 19, 2017. 12 pages.
Advisory Action for U.S. Appl. No. 14/115,844, filed Dec. 18, 2013 on behalf of Saint-Gobain Glass France. dated Nov. 28, 2017. 4 pages.
Non-Final Office Action for U.S. Appl. No. 14/115,844, filed Dec. 18, 2013 on behalf of Saint-Gobain Glass France. dated Dec. 27, 2017. 18 pages.
Non-Final Office Action for U.S. Appl. No. 14/115,091, filed Feb. 10, 2014 on behalf of Saint-Gobain Glass France. dated Apr. 6, 2018. 16 pages.
Written Opinion for PCT/EP2012/056965 filed Apr. 17, 2012 on behalf of Saint-Gobain Glass France. dated Jun. 8, 2012. 12 pages (German + English translation).
Advisory Action for U.S. Appl. No. 13/695,426, filed Oct. 30, 2012 on behalf of Saint-Gobain Glass France. dated Sep. 30, 2015. 4 pages.
Final Office Action for U.S. Appl. No. 13/695,426, filed Oct. 30, 2012 on behalf of Saint-Gobain Glass France. dated Jul. 15, 2015. 19 pages.
Final Office Action for U.S. Appl. No. 14/115,091, filed Feb. 10, 2014, on behalf of Saint-Gobain Glass France. dated Sep. 18, 2018. 15 pgs.
Final Office Action for U.S. Appl. No. 14/115,844, filed Dec. 18, 2013 on behalf of Saint-Gobain Glass France. dated Aug. 1, 2018. 19 pages.

(56) References Cited

OTHER PUBLICATIONS

International Search Report for International Application No. PCT/EP2011/052195 filed Feb. 15, 2011 on behalf of Saint-Gobain Glass France. dated May 12, 2011. 6 pages. (English Translation + German Original).
International Search Report for International Application No. PCT/EP2011/052196 filed Feb. 15, 2011 on behalf of Saint-Gobain Glass France. dated May 17, 2011. 7 pages. (English Translation + German Original).
International Search Report for International Application No. PCT/EP2011/061195 filed Jul. 4, 2011 on behalf of Saint-Gobain Glass France. dated Sep. 26, 2011. 6 pages. (English Translation + German Original).
Non-Final Office Action for U.S. Appl. No. 13/575,566, filed Jul. 26, 2012 on behalf of Saint-Gobain Glass France. dated Mar. 7, 2014. 14 pages.
Non-Final Office Action for U.S. Appl. No. 13/580,741, filed Aug. 23, 2012 on behalf of Saint-Gobain Glass France. dated Mar. 14, 2014. 13 pages.
Non-Final Office Action for U.S. Appl. No. 13/695,426, filed Oct. 30, 2012 on behalf of Saint-Gobain Glass France. dated Jan. 28, 2015. 38 pages.
Non-Final Office Action for U.S. Appl. No. 13/695,426, filed Oct. 30, 2012 on behalf of Saint-Gobain Glass France. dated Nov. 24, 2015. 10 pages.
Non-Final Office Action for U.S. Appl. No. 14/424,936, filed Feb. 27, 2015 on behalf of Saint-Gobain Glass France. dated Sep. 8, 2016. 5 pages.
Non-Final Office Action for U.S. Appl. No. 14/424,939, filed Feb. 27, 2015 on behalf of Saint-Gobain Glass France. dated Feb. 4, 2016. 15 pages.
Non-Final Office Action for U.S. Appl. No. 15/197,298, filed Jun. 29, 2016 on behalf of Saint-Gobain Glass France. dated Jul. 31, 2018. 27 pages.
Notice of Allowance for U.S. Appl. No. 13/575,566, filed Jul. 26, 2012 on behalf of Saint-Gobain Glass France. dated Jul. 7, 2014. 9 pages.
Notice of Allowance for U.S. Appl. No. 13/580,741, filed Aug. 23, 2012 on behalf of Saint-Gobain Glass France. dated Jul. 8, 2014. 10 pages.
Notice of Allowance for U.S. Appl. No. 13/695,426, filed Oct. 30, 2012 on behalf of Saint-Gobain Glass France. dated Apr. 26, 2016. 11 pages.
Restriction Requirement for U.S. Appl. No. 13/695,426, filed Oct. 30, 2012 on behalf of Saint-Gobain Glass France. dated Oct. 20, 2014. 9 pages.
Restriction Requirement for U.S. Appl. No. 15/197,298, filed Jun. 29, 2016 on behalf of Saint-Gobain Glass France. dated Mar. 22, 2018. 7 pages.
Non-Final Office Action for U.S. Appl. No. 14/424,939, filed Feb. 27, 2015 on behalf of Saint-Gobain Glass France. dated Jul. 6, 2016. 16 pages.
Written Opinion for International Application No. PCT/EP2011/052195 filed Feb. 15, 2011 on behalf of Saint-Gobain Glass France. dated May 12, 2011. 19 pages. (English Translation + German Original).
Written Opinion for International Application No. PCT/EP2011/052196 filed Feb. 15, 2011 on behalf of Saint-Gobain Glass France. dated May 17, 2011. 21 pages. (English Translation + German Original).
Written Opinion for International Application No. PCT/EP2011/061195 filed Jul. 4, 2011 on behalf of Saint-Gobain Glass France. dated Sep. 26, 2011. 19 pages. (English Translation + German Original).
Notice of Allowance for U.S. Appl. No. 14/115,844, flied Dec. 18, 2013, on behalf of Saint-Gobain Glass France, dated Jan. 9, 2019. 11 pages.
Notice of Opposition for European Application No. 12714016.8 filed Dec. 20, 2017 on behalf of Saint-Gobain Glass France, dated Sep. 28, 2018. 18 pages.
Final Office Action for U.S. Appl. No. 15/197,298, filed Jun. 29, 2016 on behalf of Saint-Gobain Glass France. dated Feb. 21, 2019. 31 pages.
International Preliminary Report on Patentability for International Application No. PCT/EP2011/052195 filed Feb. 15, 2011 on behalf of Saint-Gobain Glass France. dated Sep. 25, 2012. 21 pages. (German Original + English Translation).
International Preliminary Report on Patentability for International Application No. PCT/EP2011/052196 filed Feb. 15, 2011 on behalf of Saint-Gobain Glass France. dated Sep. 25, 2012. 22 pages. (German Original + English Translation).
International Preliminary Report on Patentability for International Application No. PCT/EP2011/061195 filed Jul. 4, 2011 on behalf of Saint-Gobain Glass France. dated Jan. 15, 2013. 21 pages. (German Original + English Translation).

\* cited by examiner

A - A'

PANE COMPRISING AN ELECTRICAL CONNECTION ELEMENT

CROSS REFERENCE TO RELATED APPLICATIONS

The present application is the US national stage of International Patent Application PCT/EP 2012/056965 filed on Apr. 17, 2012 which, in turn, claims priority to European Patent Applications EP 11165504.9 and EP 11165506.4 both filed on May 10, 2011.

The invention relates to a pane with an electrical connection element and an economical and environmentally friendly method for its manufacture.

The invention further relates to a pane with an electrical connection element for vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur that strain the panes and can cause breakage of the pane during manufacture and operation.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). The objective is to ban extremely problematic components from products resulting from the massive increase in disposable electronics. The substances affected are lead, mercury, and cadmium. This relates, among other things, to the implementation of lead-free soldering materials in electrical applications on glass and the introduction of corresponding replacement products.

EP 1 942 703 A2 discloses an electrical connection element on panes of vehicles, wherein the difference in the coefficient of thermal expansion of the pane and the electrical connection element is $<5\times10^{-6}/°$ C. and the connection element contains predominantly titanium. In order to enable adequate mechanical stability and processability, it is proposed to use an excess of solder material. The excess of solder material flows out from the intermediate space between the connection element and the electrically conductive structure. The excess of solder material causes high mechanical stresses in the glass pane. These mechanical stresses ultimately result in breakage of the pane.

The object of the present invention is to provide a pane with an electrical connection element and an economical and environmentally friendly method for its manufacture, whereby critical mechanical stresses in the pane are avoided.

The object of the present invention is accomplished according to the invention by a device according to independent claim 1. Preferred embodiments emerge from the subclaims.

The pane according to the invention with a connection element comprises the following characteristics:
- a substrate,
- an electrically conductive structure on a region of the substrate,
- a layer of a solder material on a region of the electrically conductive structure, and
- a connection element on the solder material, wherein
- the connection element contains a first and a second foot region, a first and a second transition region, and a bridge region between the first and second transition region,
- a first and a second contact surface are located on the bottom of the first and second foot regions,
- the first and second contact surface and the surfaces of the first and second transition regions facing the substrate are connected to the electrically conductive structure by the solder material, and
- the angle between the surface of the substrate and each of the tangent planes of the surfaces of the transition regions facing the substrate is <90°.

An electrically conductive structure is applied on the pane. An electrical connection element is electrically connected to the electrically conductive structure on subregions by a soldering material. The first contact surface and the surface of the first transition region facing the substrate are connected to a first subregion of the electrically conductive structure. The second contact surface and the surface of the second transition region facing the substrate are connected to a second subregion of the electrically conductive structure. The solder material flows out with an outflow width of <1 mm from the intermediate space between the connection element and the electrically conductive structure.

In a preferred embodiment, the maximum outflow width is preferably less than 0.5 mm and, in particular, roughly 0 mm. This is particularly advantageous with regard to the reduction of mechanical stresses in the pane, the adhesion of the connection element, and the reduction in the amount of solder.

The maximum outflow width is defined as the distance between the outer edges of the connection element and the point of the solder material crossover, at which the solder material drops below a layer thickness of 50 µm. The maximum outflow width is measured on the solidified solder material after the soldering process.

A desired maximum outflow width is obtained through a suitable selection of solder material volume and vertical distance between the connection element and the electrically conductive structure, which can be determined by simple experiments. The vertical distance between the connection element and the electrically conductive structure can be predefined by an appropriate process tool, for example, a tool with an integrated spacer.

The maximum outflow width can even be negative, i.e., pulled back into the intermediate space formed by an electrical connection element and an electrically conductive structure.

In an advantageous embodiment of the pane according to the invention, the maximum outflow width is pulled back in a concave meniscus in the intermediate space formed by the electrical connection element and the electrically conductive structure. A concave meniscus is created, for example, by increasing the vertical distance between the spacer and the conductive structure during the soldering process, while the solder is still fluid.

The solder material is fuzed, according to the prior art, to the electrically conductive structure during the soldering of the connection element. Then, the desired distance between the contact surface of the connection element and the electrically conductive structure is set. Excess fluid solder material flows uncontrolledly out of the intermediate space between the connection element and the electrically conductive structure. The uncontrolled solder material crossover over the outer edges of the connection element results in a large maximum outflow width. This results in critical mechanical stresses in the pane.

The advantage of the connection element according to the invention resides in the action of the capillary effect between the electrically conductive structure and the transition regions of the connection element. The capillary effect is a consequence of the small distance between the transition regions of the connection element and the electrically conductive structure. The small distance results from the angle <90° between the surface of the substrate and the tangent planes of the surfaces of the transition regions facing the substrate. The desired distance between the connection element and the electrically conductive structure is set after the melting of the solder material. Excess solder material is controlledly sucked by means of the capillary effect into the volume delimited by the transition region and the electrically conductive structure. Thus, the solder material crossover on the outer edges of the connection element is reduced and, with it, the maximum outflow width. By means of the connection element according to the invention, a reduction of the mechanical stresses in the pane is thus achieved. This is particularly advantageous with the use of a leadfree solder material that can compensate mechanical stresses less well due to its lower ductility compared to lead-containing solder materials.

In the context of the definition of the maximum outflow width, the edges of the contact surfaces to which the transition regions are connected are not outer edges of the connection element.

The cavity that is delimited by the electrically conductive structure, the transition regions, and the bridge region can be completely filled with solder material. Preferably, the cavity is not completely filled with solder material.

The substrate contains, preferably, glass, particularly preferably, flat glass, float glass, quartz glass, borosilicate glass, soda lime glass. In an alternative preferred embodiment, the substrate contains polymers, particularly preferably, polyethylene, polypropylene, polycarbonate, polymethyl methacrylate, and/or mixtures thereof.

The substrate has a first coefficient of thermal expansion. The connection element has a second coefficient of thermal expansion.

The first coefficient of thermal expansion is preferably from $8 \times 10^{-6}$/° C. to $9 \times 10^{-6}$/° C. The substrate contains, preferably, glass that has, preferably, a coefficient of thermal expansion from $8.3 \times 10^{-6}$/° C. to $9 \times 10^{-6}$/° C. in a temperature range from 0° C. to 300° C.

The connection element according to the invention preferably contains at least an iron-nickel alloy, an iron-nickel-cobalt alloy, or an iron-chromium alloy.

The connection element according to the invention contains preferably 50 wt.-% to 89.5 wt.-% iron, 0 wt.-% to 50 wt.-% nickel, 0 wt.-% to 20 wt.-% chromium, 0 wt.-% to 20 wt.-% cobalt, 0 wt.-% to 1.5 wt.-% magnesium, 0 wt.-% to 1 wt.-% silicon, 0 wt.-% to 1 wt.-% carbon, 0 wt.-% to 2 wt.-% manganese, 0 wt.-% to 5 wt.-% molybdenum, 0 wt.-% to 1 wt.-% titanium, 0 wt.-% to 1 wt.-% niobium, 0 wt.-% to 1 wt.-% vanadium, 0 wt.-% to 1 wt.-% aluminum, and/or 0 wt.-% to 1 wt.-% tungsten.

In an advantageous embodiment of the invention, the difference between the first and the second coefficient of expansion is $\geq 5 \times 10^{-6}$/° C. The second coefficient of thermal expansion is, in that case, preferably from $0.1 \times 10^{-6}$/° C. to $4 \times 10^{-6}$/° C., particularly preferably from $0.3 \times 10^{-6}$/° C. to $3 \times 10^{-6}$/° C. in a temperature range from 0° C. to 300° C.

The connection element according to the invention contains preferably at least 50 wt.-% to 75 wt.-% iron, 25 wt.-% to 50 wt.-% nickel, 0 wt.-% to 20 wt.-% cobalt, 0 wt.-% to 1.5 wt.-% magnesium, 0 wt.-% to 1 wt.-% silicon, 0 wt.-% to 1 wt.-% carbon and/or 0 wt.-% to 1 wt.-% manganese.

The connection element according to the invention contains preferably chromium, niobium, aluminum, vanadium, tungsten, and titanium at a proportion of 0 wt.-% to 1 wt.-%, molybdenum at a proportion of 0 wt.-% to 5 wt.-%, as well as production-related admixtures.

The connection element according to the invention contains preferably at least 55 wt.-% to 70 wt.-% iron, 30 wt.-% to 45 wt.-% nickel, 0 wt.-% to 5 wt.-% cobalt, 0 wt.-% to 1 wt.-% magnesium, 0 wt.-% to 1 wt.-% silicon, and/or 0 wt.-% to 1 wt.-% carbon.

The connection element according to the invention contains preferably invar (FeNi).

Invar is an iron-nickel alloy with a content of, for example, 36 wt.-% nickel (FeNi36). There is a group of alloys and compounds that have the property of having abnormally small or sometimes negative coefficients of thermal expansion in certain temperature ranges. Fe65Ni35 invar contains 65 wt.-% iron and 35 wt.-% nickel. Up to 1 wt.-% magnesium, silicon, and carbon are usually alloyed to change the mechanical properties. By alloying 5 wt.-% cobalt, the coefficient of thermal expansion a can be further reduced. One name for the alloy is Inovco, FeNi33Co4.5 with an coefficient of expansion (20° C. to 100° C.) of $0.55 \times 10^{-6}$/° C.

If an alloy such as invar with a very low absolute coefficient of thermal expansion of $<4 \times 10^{6}$/° C. is used, overcompensation of mechanical stresses occurs by noncritical pressure stresses in the glass or by noncritical tensile stresses in the alloy.

In another advantageous embodiment of the invention, the difference between the first and the second coefficient of expansion is $<5 \times 10^{-6}$/° C. Because of the small difference between the first and the second coefficient of thermal expansion, critical mechanical stresses in the pane are avoided and better adhesion is obtained. The second coefficient of thermal expansion is, in that case, preferably $4 \times 10^{-6}$/° C. to $8 \times 10^{-6}$/° C., particularly preferably $4 \times 10^{-6}$/° C. to $6 \times 10^{-6}1$° C. in a temperature range from 0° C. to 300° C.

The connection element according to the invention contains preferably at least 50 wt.-% to 60 wt.-% iron, 25 wt.-% to 35 wt.-% nickel, 15 wt.-% to 20 wt.-% cobalt, 0 wt.-% to 0.5 wt.-% silicon, 0 wt.-% to 0.1 wt.-% carbon, and/or 0 wt.-% to 0.5 wt.-% manganese.

The connection element according to the invention contains preferably kovar (FeCoNi).

Kovar is an iron-nickel-cobalt alloy that has coefficients of thermal expansion of usually roughly $5 \times 10^{-6}$/° C. The coefficient of thermal expansion is thus less than the coefficient of typical metals. The composition contains, for example, 54 wt.-% iron, 29 wt.-% nickel, and 17 wt.-% cobalt. In the area of microelectronics and microsystem technology, kovar is, consequently, used as a housing material or as a submount. Submounts lie, according to the sandwich principle, between the actual substrate material and the material with, for the most part, a clearly higher coefficient of expansion. Kovar thus serves as a compensating element which absorbs and reduces the thermo-mechanical stresses caused by the different coefficients of thermal expansion of the other materials. Similarly, kovar is used for metal-glass implementations of electronic components, material transitions in vacuum chambers.

The connection element according to the invention contains preferably iron-nickel alloys and/or iron-nickel-cobalt-alloys post-treated thermally by annealing.

In another advantageous embodiment of the invention, the difference between the first and the second coefficient of expansion is likewise $<5\times10^{-6}/°$ C. The second coefficient of thermal expansion is preferably from $9\times10^{-6}/°$ C. to $13\times10^{-6}/°$ C., particularly preferably from $10\times10^{-6}/°$ C. to $11.5\times10^{-6}/°$ C. in a temperature range from 0° C. to 300° C.

The connection element according to the invention contains preferably at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, and/or 0 wt.-% to 1 wt.-% titanium. In addition, the connection element can contain admixtures of other elements, including vanadium, aluminum, niobium, and nitrogen.

The connection element according to the invention can also contain at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and/or 0 wt.-% to 1 wt.-% titanium.

The connection element according to the invention contains preferably at least 65 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, and/or 0 wt.-% to 1 wt.-% titanium.

The connection element according to the invention can also contain at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, 0 wt.-% to 1 wt.-% niobium, and/or 0 wt.-% to 1 wt.-% titanium.

The connection element according to the invention contains preferably at least 75 wt.-% to 84 wt.-% iron, 16 wt.-% to 18.5 wt.-% chromium, 0 wt.-% to 0.1 wt.-% carbon, 0 wt.-% to 1 wt.-% manganese, and/or 0 wt.-% to 1 wt.-% titanium.

The connection element according to the invention can also contain at least 78.5 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, and/or 0 wt.-% to 1 wt.-% titanium.

The connection element according to the invention contains preferably a chromium-containing steel with a proportion of chromium greater than or equal to 10.5 wt.-% and a coefficient of thermal expansion of $9\times10^{-6}/°$ C. to $13\times10^{-6}/°$ C. Further alloy components such as molybdenum, manganese, or niobium result in improved corrosion stability or altered mechanical properties, such as tensile strength or cold formability.

The advantage of connection elements made of chromium-containing steel compared to connection elements according to the prior art made of titanium resides in the better solderability. It results from the higher thermal conductivity of 25 W/mK to 30 W/mK compared to the thermal conductivity of titanium of 22 W/mK. The higher thermal conductivity results in a more uniform heating of the connection element during the soldering process, by means of which the pointwise formation of particularly hot sites ("hot spots") is avoided. These sites are starting points for subsequent damage of the pane. Improved adhesion of the connection element to the pane results. Chromium-containing steel is, moreover, well weldable. With it, better connecting of the connection element to the onboard electronics via an electrically conductive material, e.g., copper, by welding, is possible. Due to the better cold formability, the connection element can also be better crimped with the electrically conductive material. Chromium-containing steel is, moreover, more available.

The electrically conductive structure according to the invention has, preferably, a layer thickness of 5 μm to 40 μm, particularly preferably from 5 μm to 20 μm, very particularly preferably, from 8 μm to 15 μm and, most particularly, from 10 μm to 12 μm. The electrically conductive structure according to the invention contains, preferably, silver, particularly preferably, silver particles and glass frits.

The layer thickness of the solder according to the invention is preferably $<3.0\times10^{-4}$ m.

The solder material is preferably leadfree, i.e., contains no lead. This is particularly advantageous with regard to the environmental impact of the pane with an electrical connection element according to the invention. Leadfree solder materials typically have less ductility than lead-containing solder materials, such that mechanical stresses between a connection element and a pane can be less well compensated. However, it has been demonstrated that critical mechanical stresses can be avoided by means of the connection element according to the invention. The solder material according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition according to the invention can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, or mixtures thereof.

The connection element according to the invention is coated, preferably, with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 μm to 0.3 μm nickel and/or 3 μm to 20 μm silver. The connection element can be plated with nickel, tin, copper, and/or silver. Nickel and silver improve the current-carrying capacity and corrosion stability of the connection element and the wetting with the solder material.

The angle between the surface of the substrate and each of the tangent planes of the surfaces of the transition regions of the connection element facing the substrate is preferably between 1° and 85°, particularly preferably between 2° and 75°, very particularly preferably between 3° and 60°, in particular between 5° and 50°. The angle between the surface of the substrate and the tangent planes must not be equal to 0° in the entire transition region, as, in this case, no intermediate space is formed between the transition region and the electrically conductive structure to accommodate excess solder material. The connection element according to the invention is, moreover, shaped such that the tangent planes are inclined in the direction turned away from the immediately adjacent foot region.

In a preferred embodiment of the invention, the transition regions and the bridge region of the connection element are shaped flat (i.e. planar) in sections. "Flat" means that the bottom of the connection element forms one plane.

Particularly preferably, the transition regions are shaped flat and the bridge region is shaped flat or flat in sections. Each tangent plane on a surface of a transition region facing the substrate corresponds to the flat bottom of the transition region. The surface of the substrate and the surface of the first transition region facing the substrate enclose an angle $\alpha_1$. The surface of the substrate and the surface of the second transition region facing the substrate enclose an angle $\alpha_2$. In a particularly preferred embodiment of the invention, the angle $\alpha_1$ is equal to angle $\alpha_2$. The angles $\alpha_1$ and $\alpha_2$ are not equal to 0°.

The transition regions can also be shaped flat in sections. In that case, the angles $\alpha_1$ and $\alpha_2$ must be determined in the flat segments of the transition regions adjacent the foot regions. The angles $\alpha_1$ and $\alpha_2$ are not equal to 0°. The surfaces of the remaining flat segments of the transition regions facing the substrate may enclose an angle equal to 0° with the surface of the substrate.

In another advantageous embodiment of the invention, the two transition regions and/or the bridge region are curved. The two transition regions and the bridge region have preferably the same direction of curvature and preferably form together the profile of an oval arc, particularly preferably the profile of an elliptical arc and very particularly preferably a circular arc. The radius of curvature of the circular arc is, for example, preferably from 5 mm to 15 mm with a length of the connection element of 24 mm. If the two transition regions and the bridge region have the same direction of curvature, the connections between the contact surfaces and the surfaces of the transition regions facing the substrate are formed as edges. The directions of curvature of the transition regions and/or the bridge region can also be different.

In another advantageous embodiment of the invention, the two transition regions are formed flat and the bridge region is angled. The bridge region consists of two flat subregions, which, together, enclose an angle $\gamma$. The surface of the substrate and the surface of the first transition region facing the substrate enclose an angle $\beta_1$. The surface of the substrate and the surface of the second transition region facing the substrate enclose an angle $\beta_2$. The angle $\gamma$ is $180°-\beta_1-\beta_2$. In a particularly preferred embodiment of the invention, the angles $\beta_1$ and $\beta_2$ are equal.

The iron-nickel alloy, the iron-nickel-cobalt alloy, or the iron-chromium alloy can also be welded, crimped, or glued as a compensation plate onto a connection element made, for example, of steel, aluminum, titanium, copper. As a bimetal, favorable expansion behavior of the connection element relative to the glass expansion can be obtained. The compensation plate is preferably hat-shaped.

The electrical connection element contains, on the surface facing the solder material, a coating that contains copper, zinc, tin, silver, gold, or alloys or layers thereof, preferably silver. This prevents a spreading of the solder material out beyond the coating and limits the outflow width.

The connection elements are, in the plan view, for example, preferably 1 mm to 50 mm long and wide and, particularly preferably 2 mm to 30 mm long and wide and, very particularly preferably 2 mm to 5 mm wide and 12 mm to 24 mm long.

The contact surfaces on the bottom of the foot regions are, for example, preferably 1 mm to 15 mm long and wide and particularly preferably 2 mm to 8 mm long and wide and very particularly preferably 2 mm to 5 mm wide and 2 mm to 5 mm long.

The shape of the electrical connection element can form solder depots in the intermediate space of the connection element and the electrically conductive structure. The solder depots and wetting properties of the solder on the connection element prevent the outflow of the solder material from the intermediate space. The solder depots can be rectangular, rounded, or polygonal in design.

The distribution of the soldering heat and, thus, the distribution of the solder material during the soldering process can be defined by the shape of the connection element. Solder material flows to the warmest point. For example, the connection element can have a single or double hat shape in order to distribute the heat advantageously in the connection element during the soldering process.

In an advantageous embodiment of the invention, at least one, preferably at least two spacers are arranged on each of the contact surfaces. The spacers contain, preferably, the same alloy as the connection element. Each spacer is shaped, for example, as a cube, as a pyramid, as a segment of a rotational ellipsoid, or as a segment of a sphere. The spacers have, preferably, a width of $0.5\times10^{-4}$ m to $10\times10^{-4}$ m and a height of $0.5\times10^{-4}$ m to $5\times10^{-4}$ m, particularly preferably, of $1\times10^{-4}$ m to $3\times10^{-4}$ m. By means of the spacers, the formation of a uniform layer of solder material is favored. That is particularly advantageous with regard to the adhesion of the connection element. The spacers are, in a preferred embodiment, are formed in one piece with the connection element.

The introduction of the energy during the electrical connecting of an electrical connection and an electrically conductive structure occurs preferably by means of punches, thermodes, piston soldering, preferably laser soldering, hot air soldering, induction soldering, resistance soldering, and/ or with ultrasound.

The object of the invention is further accomplished through a method for production of a pane with at least one connection element, wherein a) solder material is arranged and applied on the contact surfaces of the connection element as a platelet with a fixed layer thickness, volume, and shape, b) an electrically conductive structure is applied to a region of a substrate, c) the connection element with the solder material is arranged on the electrically conductive structure, and d) the connection element is soldered to the electrically conductive structure.

The solder material is preferably applied in advance to the connection elements, preferably as a platelet with a fixed layer thickness, volume, shape, and arrangement on the connection element.

The connection element can, for example, be welded or crimped to a sheet, a braided wire, a mesh made, for example, of copper and connected to the onboard electrical system.

The connection element according to the invention is preferably formed in one piece, but can also consist of two or more subelements connected to each other, for example, welded.

The connection element is preferably used in heated panes or in panes with antennas in buildings, in particular, in automobiles, railroads, aircraft, or watercraft. The connection element serves to connect the conducting structures of the pane to electrical systems that are arranged outside the pane. The electrical systems are amplifiers, control units, or voltage sources.

Figure 1A:
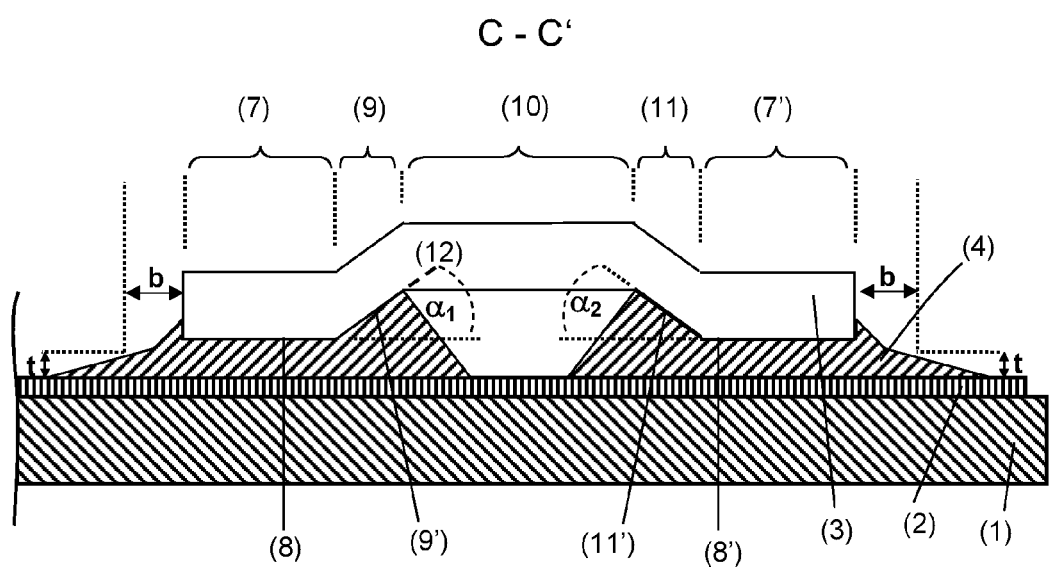
Figure 2:
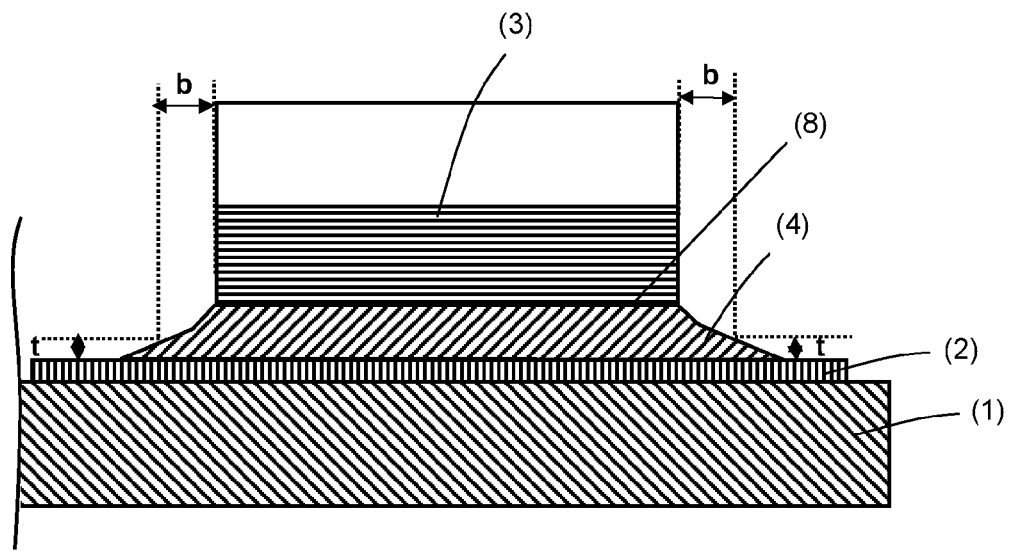
Figure 3:
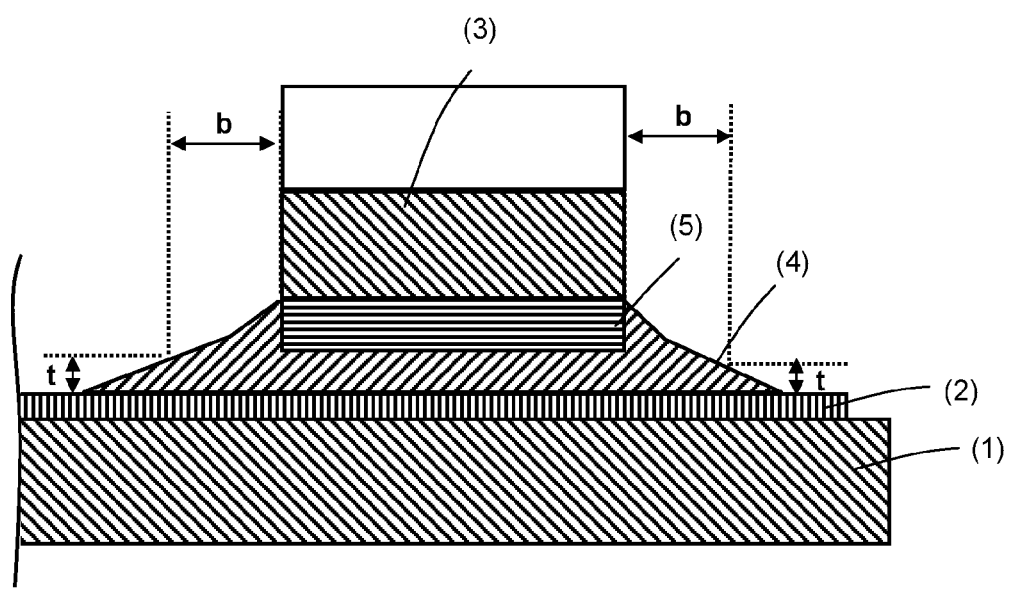
Figure 4:
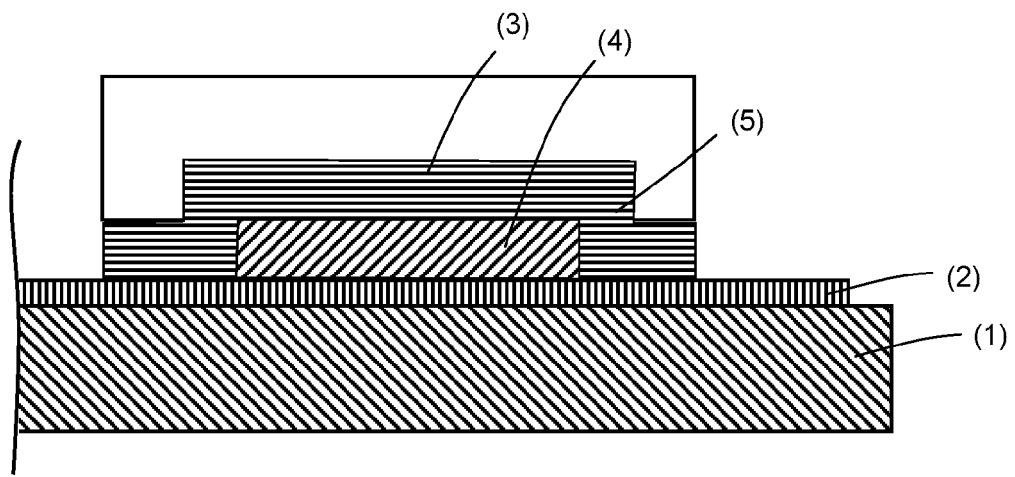
Figure 5:
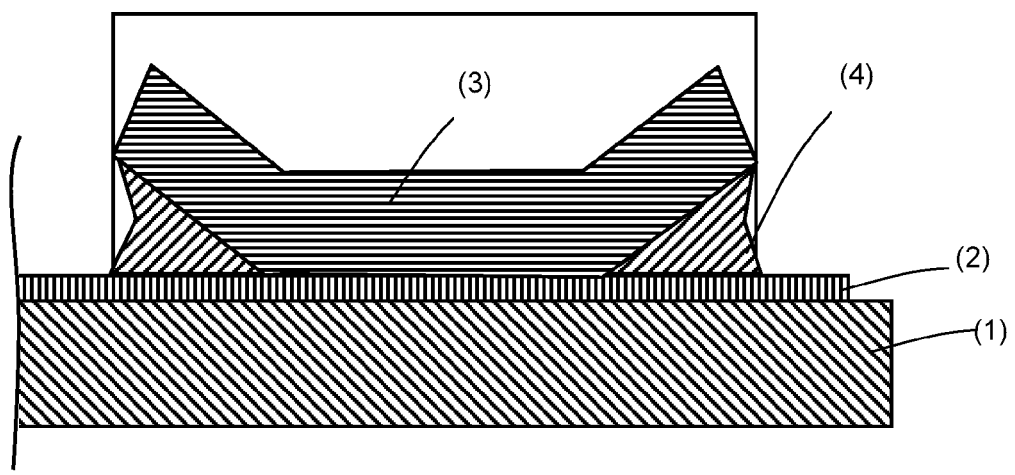
Figure 6:
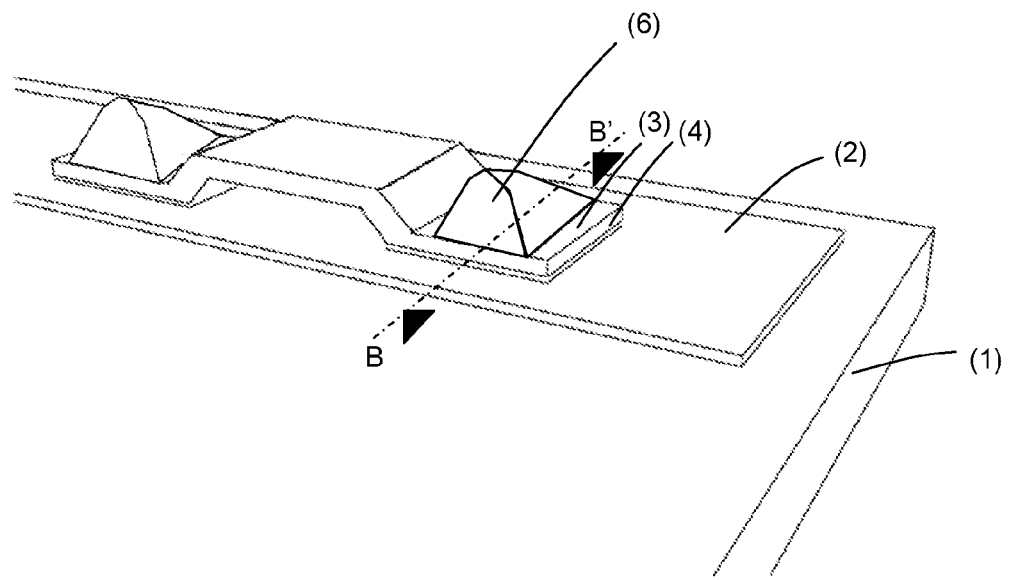
Figure 7:
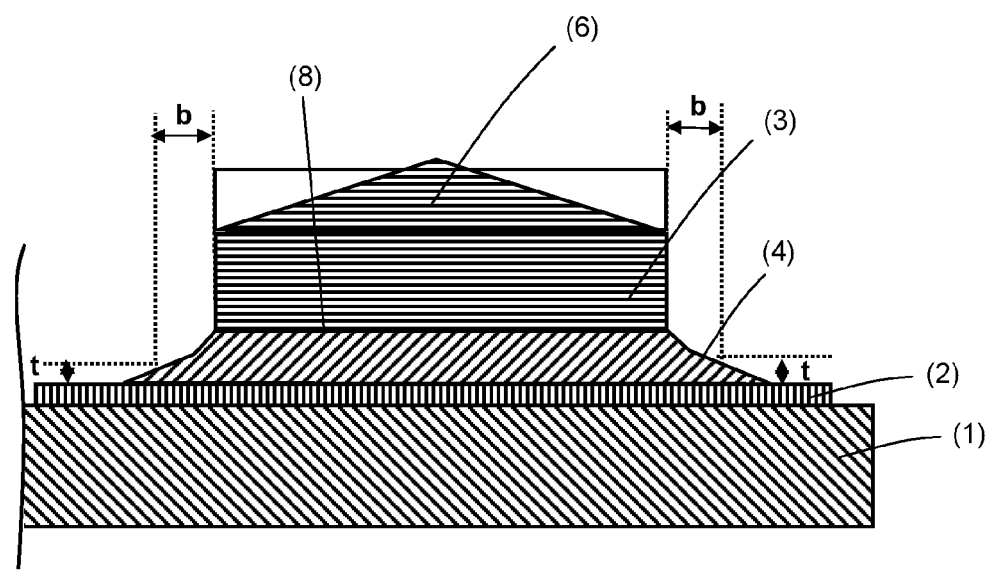
Figure 8:
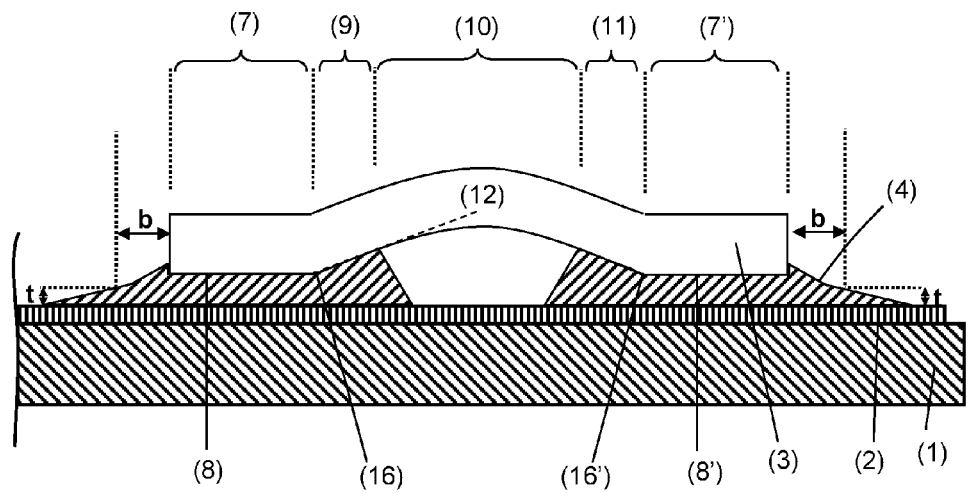
Figure 9:
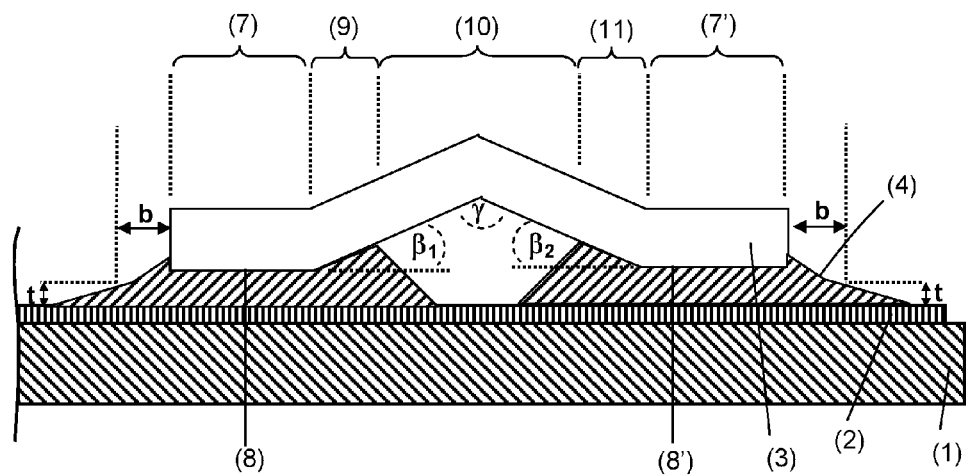
Figure 10:
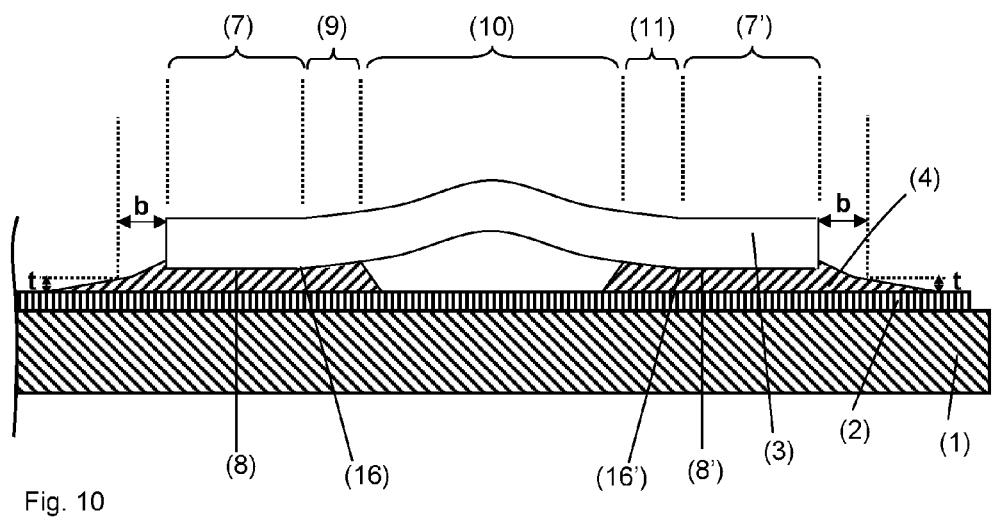
Figure 11:
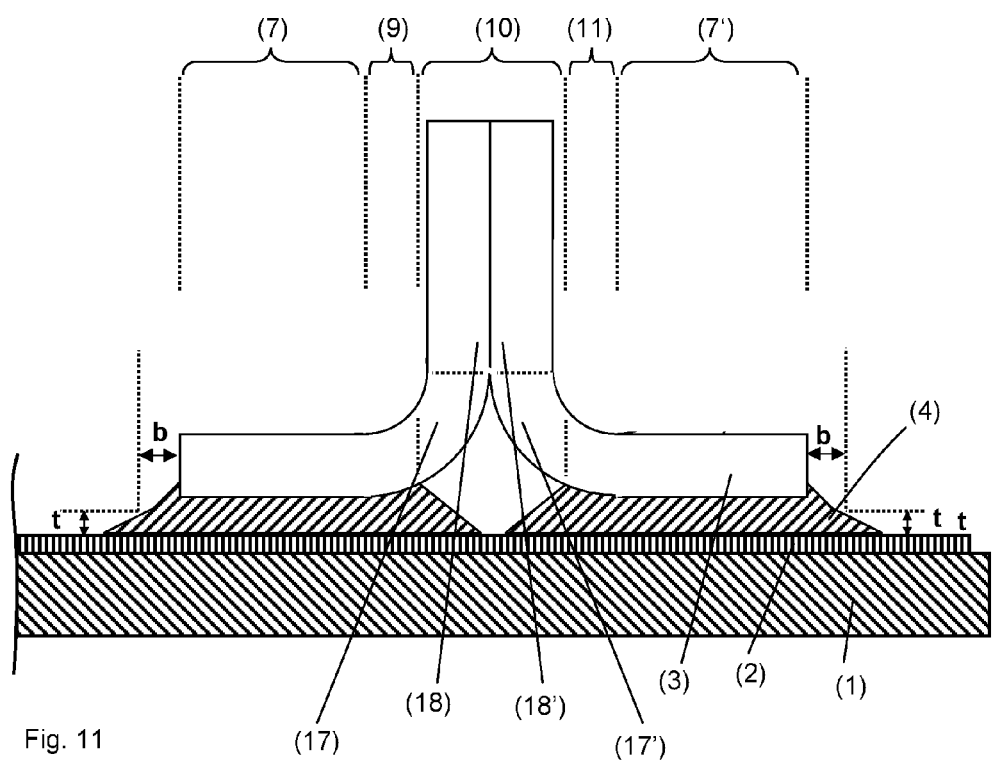
Figure 12:
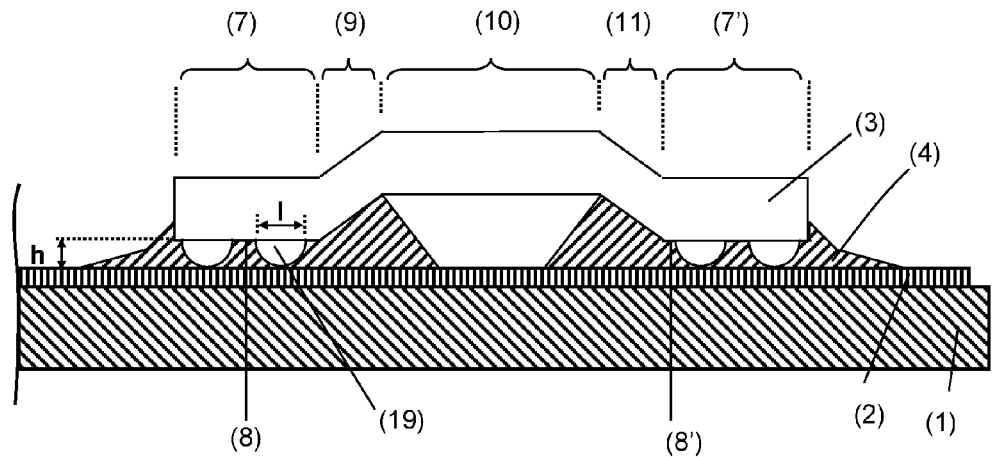
Figure 12A:
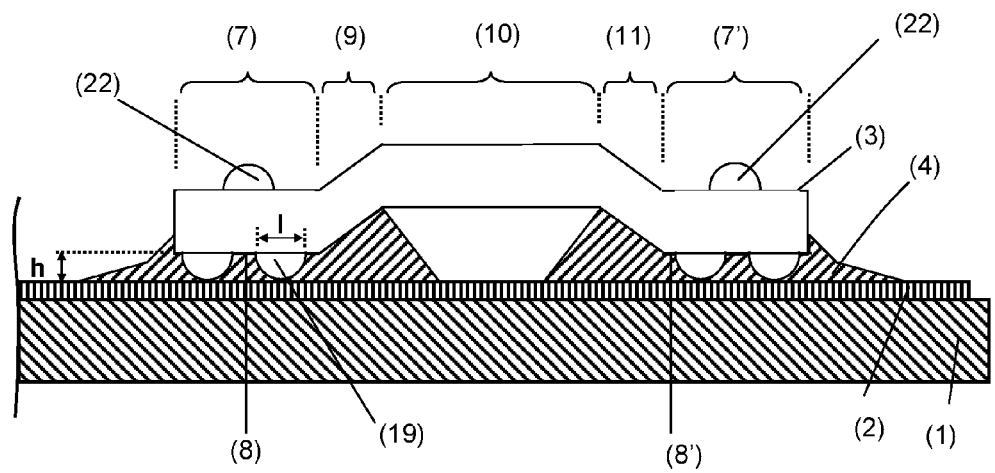
Figure 13:
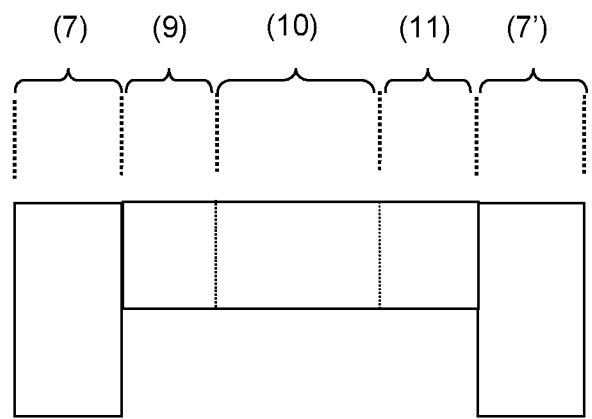
Figure 14:
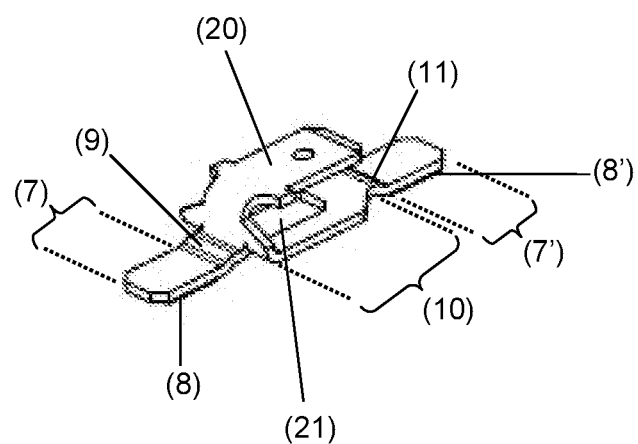
Figure 15:
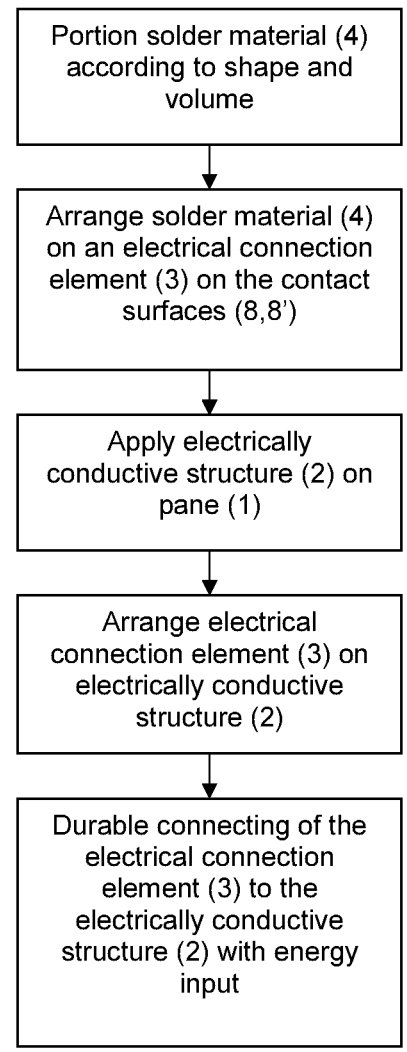

The invention is explained in detail with reference to drawings and exemplary embodiments. The drawings are a schematic representation and not true to scale. The drawings do not restrict the invention in any way. They depict:

FIG. 1 a perspective view of a first embodiment of the pane according to the invention, FIG. 1a a cross-section C-C' through the pane of FIG. 1, FIG. 2 a cross-section A-A' through the pane of FIG. 1, FIG. 3 a cross-section A-A' through an alternative pane according to the invention, FIG. 4 a cross-section A-A' through another alternative pane according to the invention, FIG. 5 a cross-section A-A' through another alternative pane according to the invention, FIG. 6 a perspective view of an alternative embodiment of the pane according to the invention, FIG. 7 a cross-section B-B' through the pane of FIG. 6, FIG. 8 a cross-section C-C' through an alternative pane according to the invention, FIG. 9 a cross-section C-C' through another alternative pane according to the invention, FIG. 10 a cross-section C-C' through another alternative pane according to the invention, FIG. 11 a cross-section C-C' through another alternative pane according to the invention, FIG. 12 a cross-section C-C' through another alternative pane according to the invention, FIG. 12a a cross-section C-C' through another alternative pane according to the invention, FIG. 13 a plan view of an alternative embodiment of the connection element, FIG. 14 a perspective view of an alternative embodiment of the connection element, and FIG. 15 a detailed flow chart of the method according to the invention.

FIG. 1, FIG. 1a, and FIG. 2 show, in each case, a detail of a heatable pane 1 according to the invention in the region of the electrical connection element 3. The pane 1 is a 3-mm-thick thermally prestressed single-pane safety glass made of soda lime glass. The pane 1 has a width of 150 cm and a height of 80 cm. An electrically conductive structure 2 in the form of a heating conductor structure 2 is printed on the pane 1. The electrically conductive structure 2 contains silver particles and glass frits. In the edge region of the pane 1, the electrically conductive structure 2 is widened to a width of 10 mm and forms a contact surface for the electrical connection element 3. In the edge region of the pane 1, there is also a covering serigraph (not shown). In the region of the contact surfaces 8 and 8' and the surfaces 9' and 11' of the transition regions 9 and 11 facing the substrate 1, the solder material 4 effects a durable electrical and mechanical connection between the connection element 3 and the electrically conductive structure 2. The solder material 4 contains 57 wt.-% bismuth, 40 wt.-% tin, and 3 wt.-% silver. The solder material 4 is arranged through a predefined volume and shape completely between the electrical connection element 3 and the electrically conductive structure 2. The solder material 4 has a thickness of 250 μm. The electrical connection element 3 is made from steel of the material number 1.4509 in accordance with EN 10 088-2 (ThyssenKrupp Nirosta® 4509) with a coefficient of thermal expansion of $10.0\times10^{-6}/°C$. The electrical connection element 3 has a width of 4 mm and a length of 24 mm. The transition regions 9 and 11 and the bridge region 10 are formed flat.

The surface of the substrate 1 and the surface 9' of the transition region 9 facing the substrate 1 enclose an angle $\alpha_1=40°$. The surface of the substrate and the surface 11' of the transition region 11 facing the substrate 1 enclose an angle $\alpha_2=40°$. The bridge region 10 is arranged parallel to the surface of the substrate 1.

Steel of the material number 1.4509 in accordance with EN 10 088-2 has good cold forming properties and good welding properties with all methods except gas welding. The steel is used for construction of sound suppressor systems and exhaust gas detoxification systems and is particularly suited for that due to its scaling resistance to more than 950° C. and corrosion resistance against the stresses occurring in the exhaust gas system.

FIG. 3 depicts, in continuation of the exemplary embodiment of FIGS. 1 and 2, an alternative embodiment of the connection element 3 according to the invention. The electrical connection element 3 is provided on the surface facing the solder material 4 with a silver-containing coating 5. This prevents spreading of the solder material out beyond the coating 5 and limits the outflow width b. In another embodiment, an adhesion-promoting layer made, for example, of nickel and/or copper, can be located between the connection element 3 and the silver-containing layer 5. The outflow width b of the solder material 4 is less than 1 mm. No critical mechanical stresses are observed in the pane 1 due to the arrangement of the solder material 4. The connection of the pane 1 to the electrical connection element 3 via the electrically conductive structure 2 is durably stable.

FIG. 4 depicts, in continuation of the exemplary embodiment of FIGS. 1 and 2, another alternative embodiment of the connection element 3 according to the invention. The electrical connection element 3 contains, on the surface facing the solder material 4, a recess with a depth of 250 μm that forms a solder depot for the solder material 4. It is possible to completely prevent outflow of the solder material 4 from the intermediate space. The thermal stresses in the pane 1 are noncritical and a durable electrical and mechanical connection is provided between the connection element 3 and the pane 1 via the electrically conductive structure 2.

FIG. 5 depicts, in continuation of the exemplary embodiment of FIGS. 1 and 2, another alternative embodiment of the connection element 3 according to the invention. The electrical connection element 3 is bent upward on the edge regions. The height of the upward bend of the edge region of the glass pane 1 is a maximum of 400 μm. This forms a space for the solder material 4. The predefined solder material 4 forms a concave meniscus between the electrical connection element 3 and the electrically conductive structure 2. It is possible to completely prevent outflow of solder material 4 from the intermediate space. The outflow width b, at roughly 0, is less than zero, largely because of the meniscus formed. The thermal stresses in the pane 1 are noncritical, and a durable electrical and mechanical connection is provided between the connection element 3 and the pane 1 via the electrically conductive structure 2.

FIG. 6 and FIG. 7 depict, in each case, a detail of another embodiment of the pane 1 according to the invention with connection element 3. The connection element 3 contains an iron-containing alloy with a coefficient of thermal expansion of $8\times10^{-6}/°C$. The material thickness is 2 mm. In the region of the contact surfaces 8 and 8' of the connection element 3, hat-shaped compensation members 6 are applied with chromium-containing steel of the material number 1.4509 in accordance with EN 10 088-2 (ThyssenKrupp Nirosta® 4509). The maximum layer thickness of the hat-shaped compensation members 6 is 4 mm. By means of the compensation members, it is possible to adapt the coefficients of thermal expansion of the connection element 3 to the requirements of the pane 1 and of the solder material 4. The hat-shaped compensation members 6 result in improved heat flow during the production of the solder connection 4. The heating occurs primarily in the center of the contact surfaces 8 and 8'. It is possible to further reduce the outflow width b of the solder material 4. Because of the low outflow width b of <1 mm and the adapted coefficient of expansion, it is possible to further reduce the thermal stresses in the pane 1. The thermal stresses in the pane 1 are noncritical, and a durable electrical and mechanical connection is provided between the connection element 3 and the pane 1 via the electrically conductive structure 2.

FIG. 8 depicts, in continuation of the exemplary embodiment of FIGS. 1 and 1a, an alternative embodiment of the connection element 3 according to the invention. The two transition regions 9 and 11 and the bridge region 10 are curved and have the same direction of curvature. Together, they form the profile of a circular arc with a radius of curvature of 12 mm. The connections 16 and 16' between the contact surfaces 8 and 8' and the surfaces 9' and 11' of the curved transition regions 9 and 11 facing the substrate are formed as edges. The thermal stresses in the pane 1 are noncritical and a durable electrical and mechanical connection is provided between the connection element 3 and the pane 1 via the electrically conductive structure 2.

FIG. 9 depicts, in continuation of the exemplary embodiment of FIGS. 1 and 1a, another alternative embodiment of the connection element 3 according to the invention. The two transition regions are formed flat; the bridge region is formed angled. The surface of the substrate 1 and the surface 9' of the transition region 9 facing the substrate enclose an angle $\beta_1=20°$. The surface of the substrate 1 and the surface 11' of the transition region 11 facing the substrate 1 enclose an angle $\beta_2=20°$. The angle $\gamma$ of the bridge region is 140°. The thermal stresses in the pane 1 are noncritical and a durable electrical and mechanical connection is provided between the connection element 3 and the pane 1 via the electrically conductive structure 2.

FIG. 10 depicts, in continuation of the exemplary embodiment of FIGS. 1 and 1a, another alternative embodiment of the connection element 3 according to the invention. The two transition regions 9 and 11 and the bridge region 10 are curved. The structure made of the transition regions 9 and 11 and the bridge region 10 changes its direction of curvature twice. Adjacent the foot regions 7 and 7', the direction of curvature of the transition regions 9 and 11 turns away from the substrate 1. Thus, there are no edges on the connections 16 and 16' between the contact surfaces 8 and 8' and the surfaces 9' and 11' of the curved transition regions 9 and 11 facing the substrate. The bottom of the connection element has a continuous progression. The thermal stresses in the pane 1 are noncritical and a durable electrical and mechanical connection is provided between the connection element 3 and the pane 1 via the electrically conductive structure 2.

FIG. 11 depicts another alternative embodiment of the connection element 3 according to the invention. The two transition regions 9 and 11 are curved, with the direction of curvature turning away from the substrate 1. The bridge region 10 consists of two subelements. The subelements have, in each case, a curved subregion 17 and 17' and a flat subregion 18 and 18'. The bridge region 10 is connected via the subregion 17 to the transition region 9 and via the subregion 17' to the transition region 11. The curved subregions 17 and 17' have the same direction of curvature as the adjacent transition region. The flat subregions 18 and 18' are arranged perpendicular to the surface of the substrate and are in direct contact with each other.

FIG. 12 depicts, in continuation of the exemplary embodiment of FIGS. 1 and 1a, an alternative embodiment of the connection element 3 according to the invention. The foot regions 7 and 7', the transition regions 9 and 11, and the bridge region 10 are formed as in FIG. 1a. The contact surfaces 8 and 8' have a width of 4 mm and a length of 4 mm. Spacers 19 are applied on the contact surfaces 8 and 8'. The spacers are formed as hemispheres and have a height h of $2.5\times10^{-4}$ m and a width l of $5\times10^{-4}$ m.

The spacers 19 can, in alternative embodiments, also be designed, for example, as a cube, as a pyramid, or as a segment of a rotational ellipsoid and preferably have a width of $0.5\times10^{-4}$ m to $10\times10^{-4}$ m and a height of $0.5\times10^{-4}$ m to $5\times10^{-4}$ m, particularly preferably of $1\times10^{-4}$ m to $3\times10^{-4}$ m. By means of the spacers 19, the formation of a uniform layer of solder material 4 is favored. That is particularly advantageous with regard to the adhesion of the connection element 3.

FIG. 12a depicts, in continuation of the exemplary embodiment of FIG. 12, another alternative embodiment of the connection element 3 according to the invention. On each of the surfaces of the foot regions 7, 7' facing away from the substrate 1, a contact bump 22 is arranged. The contact bumps 22 are formed, in the embodiment shown, as hemispheres and have a height of $2.5\times10^{-4}$ m and a width of $5\times10^{-4}$ m. The centers of the contact bumps 22 are arranged roughly in the geometric center of the surfaces of the foot regions 7, 7' facing away from the substrate 1. Because of their convex surface, the contact bumps 22 enable an advantageously improved soldering of the connection element to the electrically conductive structure 2. For the soldering, electrodes whose contact side is flat can be used. The electrode surface is brought into contact with the contact bump 22, with the contact region between the electrode surface and the contact bump 22 forming the soldering point. The position of the soldering point is thus determined preferably by the point on the convex surface of the contact bump 22 that has the greatest vertical distance from the surface of the substrate 1. The position of the soldering point is independent of the position of the solder electrode on the connection element 3. That is particularly advantageous with regard to a reproducible, uniform heat distribution during the soldering process.

The heat distribution during the soldering process is determined by the position, the size, the arrangement, and the geometry of the contact bump 22. In alternative embodiments, the contact bump 22 can be shaped, for example, as a segment of a rotational ellipsoid or as a cuboid, with the surface of the cuboid turned away from the substrate curved convexly. The contact bumps 22 preferably have a height of 0.1 mm to 2 mm, particularly preferably of 0.2 mm to 1 mm. The length and width of the contact bumps 22 is preferably between 0.1 and 5 mm, very particularly preferably between 0.4 mm and 3 mm.

The contact bumps 22 and spacers 19 can, in an advantageous embodiment, be formed in one piece with the connection element 3. The contact bumps 22 and the spacers 19 can, for example, be formed by reshaping a connection element 3 with a flat surface in the initial state on the surface, for example, by stamping or deep drawing. In the process, a corresponding depression can be created on the surface of the connection element 3 opposite the contact bump 22 or the spacer 19.

By means of the contact bumps 22 and the spacers 19, a homogeneous, uniformly thick, and uniformly fuzed layer of the solder material 4 is obtained. Thus, mechanical stresses between the connection element 3 and substrate 1 can be reduced. This is particularly advantageous with the use of a leadfree solder material that can compensate mechanical stresses less well due to its lower ductility compared to lead-containing solder materials.

FIG. 13 depicts a plan view of an alternative embodiment of the connection element 3 according to the invention. The transition regions 9 and 11 and the bridge region 10 are formed as in FIG. 1a. Each foot region 7 and 7' has a width of 8 mm and is twice as wide as the transition regions 9 and 11 and the bridge region 10. It has been surprisingly demonstrated that foot regions 7,7' that are designed wider than the transition regions 9.11 and the bridge region 10 result in a reduction of mechanical stresses in the pane 1. The width of the foot regions 7,7' is preferably from 150% to 300% of the width of the bridge region 10.

FIG. 14 depicts a perspective view of an alternative embodiment of the connection element 3 according to the invention. The foot regions 7 and 7' have, for example, a length of 7 mm and a width of 5 mm. The bridge region 10 is designed flat and has, for example, a length of 12 mm and a width of 10 mm. The bridge region 10 is wider than the foot regions 7,7' and has a production-related indentation 21. The indentation 21 runs all the way to the edge of the bridge region 10, to which the first foot region 7 is connected via the transition region 9. The indentation 21 corresponds in shape and size to the segment of the connection element 3 from the first foot region 7 and the transition region 9. The contact surfaces 8 and 8' on the bottoms of the foot regions 7 and 7' have a rectangular shape, with the two corners turned away from the bridge region 10 beveled in each case. By means of the beveling, angles that are too small, in particular 90°-angles along the surrounding side edges of the contact surfaces 8, 8' are avoided. It has been demonstrated that mechanical stresses in the pane can thus be reduced.

The connection element 3 includes a plug connector 20 arranged on the bridge region 10. The plug connector 20 is connected to the bridge region 10, on the side edge of the bridge region 10 adjacent the transition region 9. The plug connector 20 is designed as a standardized tab connector to which the coupling of a connection cable (not shown) to the onboard electronics, for instance, can be attached.

The particular advantage of the embodiment of the invention resides in simple production of the connection element 3, providing, at the same time, a convenient interface for electrical contacting (plug connector 20). The foot regions 7, 7', the transition region 9, the bridge region 10, and the plug connector 20 are formed in one piece. The connection element 3 is provided in a flat initial state, in which the segments provided as the transition region 9 and as the foot region 7 are arranged inside the indentation 21. In the initial state, the transition region 11 and the foot region 7' are arranged in the same plane as the bridge region 10. The plug connector 20 is also arranged, in the initial state, in the same plane as the bridge region 10. The region provided as the foot region 7 and transition region 9 can be separated from the bridge region 10, for example, by punching, laser beam machining, or waterjet machining, with a connection remaining between the transition region 9 and the bridge region 10 via the connecting edge. The plug connector 20 is bent around the connecting line between the plug connector 20 and the bridge region 10 into the position depicted, with the surface that faces upward in the initial state then facing the bridge region 10. The transition region 9 and the foot region 7 are bent above the connecting line between the transition region 8 and the bridge region 10 into the position depicted, with the surface that faces upward in the initial state then forming the bottom side of the foot region 7 and of the transition region 9. The indentation 21 is formed by the bending of the transition region 9 and the foot 7 region. The transition region 11 and the foot region 7' are also bent from the flat initial state into the position depicted.

FIG. 15 depicts in detail a method according to the invention for manufacture of a pane 1 with an electrical connection element 3. An example of the method according to the invention for manufacture of a pane with an electrical connection element 3 is presented there. As the first step, it is necessary to portion the solder material 4 according to shape and volume. The portioned solder material 4 is arranged on the contact surfaces 8 and 8' of the electrical connection element 3. The electrical connection element 3 is arranged with the solder material 4 on the electrically conductive structure 2. A durable connection of the electrical connection element 3 to the electrically conductive structure 2 and, thus, to the pane 1 takes place through the input of energy.

EXAMPLE

Test specimens were produced with the pane 1 (thickness 3 mm, width 150 cm, and height 80 cm), the electrically conductive structure 2 in the form of a heating conductor structure, the electrical connection element 3 according to FIG. 1, the silver layer 5 on the contact surfaces 8 and 8' of the connection element 3, and the solder material 4. The angle between the surface of the substrate 1 and the surface 9' of the transition region 9 facing the substrate 1 or between the surface of the substrate 1 and the surface 11' of the transition region 11 facing the substrate 1 was α=40°. The material thickness of the connection element 3 was 0.8 mm. The connection element 3 contained steel of the material number 1.4509 in accordance with EN 10 088-2 (Thyssen-Krupp Nirosta® 4509). The contact surfaces 8 and 8' of the connection elements 3 had a width of 4 mm and a length of 4 mm. The solder material 4 was applied in advance as a platelet with fixed layer thickness, volume, and shape on the contact surfaces 8 and 8' of the connection element 3. The connection element 3 was applied with the solder material 4 applied on the electrically conductive structure 2. The connection element 3 was soldered onto the electrically conductive structure 2 at a temperature of 200° C. and a processing time of 2 seconds. Outflow of the solder material 4 from the intermediate space between the electrical connection element 3 and the electrically conductive structure 2, which exceeded a layer thickness t of 50 μm, was observed only to a maximum outflow width of b=0.4 mm. The dimensions and compositions of the electrical connection element 3, the silver layer 5 on the contact surfaces 8 and 8' of the connection element 3, and the solder material 4 are found in Table 1. No critical mechanical stresses were observed in the pane 1 due to the arrangement of the solder material 4, predefined by the connection element 3 and the electrically conductive structure 2. The connection of the pane 1 to the electrical connection element 3 via the electrically conductive structure 2 was durably stable.

With all specimens, it was possible to observe, with a temperature difference from +80° C. to −30° C., that no glass substrate 1 broke or showed damage. It was possible to demonstrate that, shortly after soldering, these panes 1 with the soldered connection element 3 were stable against a sudden temperature drop.

In addition, test specimens were executed with a second composition of the electrical connection element 3. Here, the connection element 3 contained an iron-nickel-cobalt alloy. The dimensions and compositions of the electrical connection element 3, the silver layer 5 on the contact surfaces 8 and 8' of the connection element 3, and the solder material 4 are found in Table 2. With the outflow of the solder material 4 from the intermediate space between the electrical connection element 3 and the electrically conductive structure 2, which exceeded a layer thickness t of 50 μm, an average outflow width b=0.4 mm was obtained. Here as well, it was possible to observe that, with a temperature difference from +80° C. to −30° C., no glass substrate 1 broke or showed damage. It was possible to demonstrate that, shortly after soldering, these panes 1 with the soldered connection element 3 were stable against a sudden temperature drop.

In addition, test specimens were executed with a third composition of the electrical connection element 3. Here, the connection element 3 contained an iron-nickel alloy. The dimensions and compositions of the electrical connection element 3, the silver layer 5 on the contact surfaces 8 and 8' of the connection element 3, and the solder material 4 are found in Table 3. With the outflow of the solder material 4 from the intermediate space between the electrical connection element 3 and the electrically conductive structure 2, which exceeded a layer thickness t of 50 μm, an average outflow width b=0.4 mm was obtained. Here as well, it was possible to observe that, with a temperature difference from +80° C. to −30° C., no glass substrate 1 broke or showed damage. It was possible to demonstrate that, shortly after soldering, these panes 1 with the soldered connection element 3 were stable against a sudden temperature drop.

TABLE 1

| Components | Material | Example |
|---|---|---|
| Connection element 3 | Steel of material no. 1.4509 in accordance with EN 10 088-2 with the composition: | |
| | Iron (wt.-%) | 78.87 |
| | Carbon (wt.-%) | 0.03 |
| | Chromium (wt.-%) | 18.5 |
| | Titanium (wt.-%) | 0.6 |
| | Niobium (wt.-%) | 1 |
| | Manganese (wt.-%) | 1 |
| | CTE (coefficient of thermal expansion) ($10^{-6}/°$ C. for 0° C.-100° C.) | 10 |
| | Difference between CTE of the connection element and substrate ($10^{-6}/°$ C. for 0° C.-100° C.) | 1.7 |
| | Thickness of the connection element (m) | $8.0 \times 10^{-4}$ |
| | Angle α (°) | 40 |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

TABLE 2

| Components | Material | Example |
|---|---|---|
| Connection element 3 | Iron (wt.-%) | 54 |
| | Nickel (wt.-%) | 29 |
| | Cobalt (wt.-%) | 17 |
| | CTE (coefficient of thermal expansion) ($10^{-6}/°$ C. for 0° C.-100° C.) | 5.1 |
| | Difference between CTE of the connection element and substrate ($10^{-6}/°$ C. for 0° C.-100° C.) | 3.2 |
| | Thickness of the connection element (m) | $8.0 \times 10^{-4}$ |
| | Angle α (°) | 40 |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

TABLE 3

| Components | Material | Example |
|---|---|---|
| Connection element 3 | Iron (wt.-%) | 65 |
| | Nickel (wt.-%) | 35 |
| | CTE (coefficient of thermal expansion) ($10^{-6}/°$ C. for 0° C.-100° C.) | 1.7 |
| | Difference between CTE of the connection element and substrate ($10^{-6}/°$ C. for 0° C.-100° C.) | 6.6 |
| | Thickness of the connection element (m) | $8.0 \times 10^{-4}$ |
| | Angle α (°) | 40 |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}/°$ C. for 0° C.-320° C.) | 8.3 |

COMPARATIVE EXAMPLE 1

The comparative example was carried out the same as the example. The connection element contained steel of the material number 1.4509 in accordance with EN 10 088-2 (ThyssenKrupp Nirosta® 4509). The difference resided in the shape of the connection element. The angle α was, according to the prior art, 90°. With it, no capillary forces could develop on the edges of the contact surfaces 8 and 8'. The dimensions and components of the electrical connection element 3, of the metal layer on the contact surfaces 8 and 8' of the connection element 3, and of the solder material 4 are found in Table 4. The connection element 3 was soldered to the electrically conductive structure 2 as in the example by means of the solder material 4. With the outflow of the solder material 4 from the intermediate space between the electrical connection element 3 and the electrically conductive structure 2, which exceeded a layer thickness t of 50 μm, an average outflow width b=0.5 mm was obtained.

With all specimens, it was possible to observe, with a temperature difference from +80° C. to −30° C., that no glass substrate 1 broke or showed damage. It was possible to demonstrate that, shortly after soldering, these panes 1 with the soldered connection element 3 were stable against a sudden temperature drop. However, compared to the example, they exhibited a greater average outflow width b.

TABLE 4

| Components | Material | Comparative example |
|---|---|---|
| Connection element 3 | Steel of material no. 1.4509 in accordance with EN 10 088-2 with the composition: | |
| | Iron (wt.-%) | 78.87 |
| | Carbon (wt.-%) | 0.03 |
| | Chromium (wt.-%) | 18.5 |
| | Titanium (wt.-%) | 0.6 |
| | Niobium (wt.-%) | 1 |
| | Manganese (wt.-%) | 1 |
| | CTE (coefficient of thermal expansion) ($10^{-6}$/° C. for 0° C.-100° C.) | 10 |
| | Difference between CTE of the connection element and the substrate ($10^{-6}$/° C. for 0° C.-100° C.) | 1.7 |
| | Thickness of the connection element (m) | $8.0 \times 10^{-4}$ |
| | Angle α (°) | 90 |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}$/° C. for 0° C.-320° C.) | 8.3 |

COMPARATIVE EXAMPLE 2

The comparative example was carried out the same as the example. The difference resided in the use of a different material for the connection element 3. The connection element 3 was 100 wt.-% titanium. The dimensions and components of the electrical connection element 3, the metal layer on the contact surfaces 8 and 8' of the connection element 3, and the solder material 4 are found in Table 5. The connection element 3 was soldered to the electrically conductive structure 2 in accordance with conventional methods by means of the solder material 4. With the outflow of the solder material 4 from the intermediate space between the electrical connection element 3 and the electrically conductive structure 2, which exceeded a layer thickness t of 50 µm, an average outflow width b=2 mm to 3 mm was obtained. The large outflow width resulted in critical mechanical stresses in the pane.

With a sudden temperature difference from +80° C. to −30° C., it was observed that the glass substrates 1 had major damage shortly after soldering.

TABLE 5

| Components | Material | Comparative Example |
|---|---|---|
| Connection element 3 | Titanium (wt.-%) | 100 |
| | CTE (coefficient of thermal expansion) ($10^{-6}$/° C. for 0° C.-100° C.) | 8.80 |
| | Difference between CTE of the connection element and the substrate ($10^{-6}$/° C. for 0° C.-100° C.) | 0.5 |

TABLE 5-continued

| Components | Material | Comparative Example |
|---|---|---|
| | Thickness of the connection element (m) | $8.0 \times 10^{-4}$ |
| | Angle α (°) | 40 |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}$/° C. for 0° C.-320° C.) | 8.3 |

COMPARATIVE EXAMPLE 3

The comparative example was carried out the same as the example. The difference resided in the use of a different material for the connection element 3. The connection element 3 was 100 wt.-% copper. The dimensions and components of the electrical connection element 3, the metal layer on the contact surfaces 8 and 8' of the connection element 3, and the solder material 4 are found in Table 5. The connection element 3 was soldered to the electrically conductive structure 2 in accordance with conventional methods by means of the solder material 4. With the outflow of the solder material 4 from the intermediate space between the electrical connection element 3 and the electrically conductive structure 2, which exceeded a layer thickness t of 50 µm, an average outflow width b=2 mm to 3 mm was obtained. The large difference in the coefficients of thermal expansion between connection element 3 and substrate 1 as well as the large outflow width resulted in critical mechanical stresses in the pane.

With a sudden temperature difference from +80° C. to −30° C., it was observed that the glass substrates 1 had major damage shortly after soldering.

TABLE 6

| Components | Material | Comparative Example |
|---|---|---|
| Connection element 3 | Copper | 100 |
| | CTE (coefficient of thermal expansion) ($10^{-6}$/° C. for 0° C.-100° C.) | 16 |
| | Difference between CTE of the connection element and the substrate ($10^{-6}$/° C. for 0° C.-100° C.) | 7.7 |
| | Thickness of the connection element (m) | $8.0 \times 10^{-4}$ |
| | Angle α (°) | 40 |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}$/° C. for 0° C.-320° C.) | 8.3 |

The differences in the above Tables 1 to 6, the advantages of the connection element 3 according to the invention, and the observations are found in Tables 7 and 8.

TABLE 7

Embodiment According to the Invention, Example

|  | Table 1 | Table 2 | Table 3 |
|---|---|---|---|
| Material | Steel of material no. 1.4509 in accordance with EN 10 088-2 | Iron (54 wt.-%) Nickel (29 wt.-%) Cobalt (17 wt.-%) | Iron (65 wt.-%) Nickel (35 wt.-%) |
| CTE (coefficient of thermal expansion) of the connection element ($10^{-6}$/° C. for 0° C.-100° C.) | 10 | 5.1 | 1.7 |
| Difference between CTE of the connection element and the substrate ($10^{-6}$/° C. for 0° C.-100° C.) | 1.7 | 3.2 | 6.6 |
| Angle α (°) | 40 | 40 | 40 |
| Outflow width b (mm) | 0.4 | 0.4 | 0.4 |
| Observation | Stable against sudden temperature drop | Stable against sudden temperature drop | Stable against sudden temperature drop |

TABLE 8

|  | Comparative example 1 Table 4 | Comparative example 2 Table 5 | Comparative example 3 Table 6 |
|---|---|---|---|
| Material | Steel of material no. 1.4509 in accordance with EN 10 088-2 | Titanium (100 wt.-%) | Copper (100 wt.-%) |
| CTE (coefficient of thermal expansion) of the connection element ($10^{-6}$/° C. for 0° C.-100° C.) | 10 | 8.8 | 16 |
| Difference between CTE of the connection element and the substrate ($10^{-6}$/° C. for 0° C.-100° C.) | 1.7 | 0.5 | 7.7 |
| Angle α (°) | 90 | 40 | 40 |
| Outflow width b (mm) | 0.5 | 2-3 | 2-3 |
| Observation | Stable against sudden temperature drop | Substrate with major damage | Substrate with major damage |

It was demonstrated that panes according to the invention with glass substrates 1 and electrical connection elements 3 according to the invention had a low outflow width and better stability against sudden temperature differences.

This result was unexpected and surprising for the person skilled in the art.

LIST OF REFERENCE CHARACTERS (1) Pane
(2) Electrically conductive structure
(3) Electrical connection element
(4) Solder material
(5) Wetting layer
(6) Compensation member
(7) Foot region of the electrical connection element 3
(7') Foot region of the electrical connection element 3
(8) Contact surface of the connection element 3
(8') Contact surface of the connection element 3
(9) Transition region of the electrical connection element 3
(9') Surface of the transition region 9 facing the substrate 1
(10) Bridge region of the electrical connection element 3
(11) Transition region of the electrical connection element 3
(11') Surface of the transition region 11 facing the substrate 1
(12) Tangent plane of the surface 9'
(16) Connection of contact surface 8 and surface 9' of the transition region 9
(16') Connection of contact surface 8' and surface 11' of the transition region 11
(17) Subregion of the bridge region 10
(17') Subregion of the bridge region 10
(18) Subregion of the bridge region 10
(18') Subregion of the bridge region 10
(19) Spacer
(20) Plug connector
(21) Indentation
(22) Contact bump
$\alpha_1$ Angle between surface of the substrate 1 and surface 9'
$\alpha_2$ Angle between surface of the substrate 1 and surface 11'
$\beta_1$ Angle between surface of the substrate 1 and surface 9'
$\beta_2$ Angle between surface of the substrate 1 and surface 11'
γ Angle between the flat segments of an angled bridge element 10
b Maximum outflow width of the solder material
t Limiting thickness of the solder material
h Height of the spacer 19
l Width of the spacer 19
A-A' Section line
B-B' Section line
C-C' Section line

The invention claimed is:

1. A pane with at least one electrical connection element, comprising:
   a substrate for applying an electrically conductive structure on a region of the substrate, the substrate having a first coefficient of thermal expansion from $8\times10^{-6}$/° C. to $9\times10^{-6}$/° C.;
   a layer of a leadfree solder material on a region of the electrically conductive structure; and
   a connection element on the layer of solder material, wherein
   the connection element has a second coefficient of thermal expansion from $10\times10^{-6}$/° C. to $13\times10^{-6}$/° C.,
   the connection element contains at least 50 wt.-% to 89.5 wt.-% iron, 16 wt.-% to 20 wt.-% chromium, and one or more selected form the group of carbon, nickel, manganese, molybdenum, and titanium,
   the difference between the first coefficient of thermal expansion of the substrate and the second coefficient of thermal expansion of the connection element is less than $5\times10^{-6}$/° C., the connection element contains a first and a second foot region, a first and a second transition region, and a bridge region between the first and the second transition region, a first and a second contact surface are located on a bottom of the first and the second foot region, wherein the first and second foot region, the first and second transition region and the bridge region have a same width, the first and second contact surface and surfaces of the first and the second transition region facing the substrate are directly connected to the electrically conductive structure by the layer of solder material, wherein the surface of the first transition region facing the substrate directly adjoins the first contact surface and the surface of the second transition region facing the substrate directly adjoins the second contact surface;

an angle between a surface of the substrate and each tangent plane of the surfaces of the first and the second transition regions facing the substrate is greater than 0° and less than 90°, and a cavity that is delimited by the electrically conductive structure, the transition regions, and the bridge region is completely or not completely filled with solder material.

2. The pane according to claim 1, wherein the substrate contains glass, polymers, or mixtures of glass and polymers.

3. The pane according to claim 2, wherein the glass is flat glass, float glass, quartz glass, borosilicate glass, and soda lime glass.

4. The pane according to claim 2, wherein the polymers are polyethylene, polypropylene, polycarbonate, and polymethyl methacrylate.

5. The pane according to claim 1, wherein an angle between a surface of the substrate and each tangent plane of surfaces of the first and the second transition region facing the substrate is between 2° and 75°.

6. The pane according to claim 5, wherein the angle between the surface of the substrate and each tangent plane of the surfaces of the first and the second transition region facing the substrate is between 5° and 50°.

7. The pane according to claim 1, wherein the first transition region, the second transition region, and the bridge region are shaped flat in sections.

8. The pane according to claim 1, wherein the first transition region, the second transition region, and / or the bridge region are curved.

9. The pane according to claim 8, wherein the first transition region, the second transition region, and/or the bridge region have the same direction of curvature.

10. The pane according to claim 1, wherein the first transition region and the second transition region are shaped flat and the bridge region is shaped angled.

11. The pane according to claim 1, wherein spacers are arranged on the first and the second contact surfaces.

12. The pane according to claim 1, wherein the solder material contains tin and i) bismuth, ii) indium, iii) zinc, iv) copper, v) silver, or compositions of i)-v).

13. The pane according to claim 12, wherein a proportion of tin in the solder material is 3 wt.-% to 99.5 wt.-% and the proportion of i) bismuth, ii) indium, iii) zinc, iv) copper, v) silver, or compositions of i)-v) is 0.5 wt.-% to 97 wt.-%.

14. The pane according to claim 1, wherein the connection element is coated with nickel, tin, copper, and/or silver.

15. The pane according to claim 14, wherein the connection element is coated with 0.1 µm to 0.3 µm nickel and or 3 µm to 20 µm silver.

16. The pane according to claim 1, wherein the connection element has a second coefficient of thermal expansion from $10 \times 10^{-6}/°$ C. to $11.5 \times 10^{-6}/°$ C.

17. A method for production of a pane with at least one electrical connection element, comprising:

a) arranging and applying a leadfree solder material on contact surfaces of a connection element as a platelet with a fixed layer thickness, volume, and shape;

b) applying an electrically conductive structure to a region of a substrate, the substrate having a first coefficient of thermal expansion from $8 \times 10^{-6}/°$ C. to $9 \times 10^{-6}/°$ C.;

c) arranging the connection element with the solder material on the electrically conductive structure, the connection element having a second coefficient of thermal expansion from $10 \times 10^{-6}/°$ C. to $13 \times 10^{-6}/°$ C., wherein the connection element contains at least 50 wt.-% to 89.5 wt.-% iron, 16 wt.-% to 20 wt.-% chromium, and one or more selected form the group of carbon, nickel, manganese, molybdenum, and titanium, and wherein the difference between the first coefficient of thermal expansion of the substrate and the second coefficient of thermal expansion of the connection element is less than $5 \times 10^{-6}/°$ C., and d) soldering the connection element to the electrically conductive structure, wherein a cavity that is delimited by the electrically conductive structure, the transition regions, and the bridge region is completely or not completely filled with solder material, the connection element contains a first and a second foot region, a first and a second transition region, and a bridge region between the first and the second transition region, wherein the first and foot region, the first and second transition region and the bridge region have a same width, a first and a second contact surface are located on a bottom of the first and the second foot region, the first and second contact surface and surfaces of the first and the second transition region facing the substrate are directly connected to the electrically conductive structure by the layer of solder material, wherein the surface of the first transition region facing the substrate directly adjoins the first contact surface and the surface of the second transition region facing the substrate directly adjoins the second contact surface, an angle between a surface of the substrate and each tangent plane of the surfaces of the first and the second transition regions facing the substrate is greater than 0° and less than 90°.

18. The method of production according to claim 17, wherein the connection element has a second coefficient of thermal expansion from $10 \times 10^{-6}/°$ C to $11.5 \times 10^{-6}/°$ C.

19. A method, comprising:

using a pane with at least one electrical connection element, for vehicles with electrically conductive structures, preferably with heating conductors and/or antenna conductors, the pane including a substrate for applying an electrically conductive structure on a region of the substrate, the substrate having a first coefficient of thermal expansion from $8 \times 10^{-6}/°$ C. to $9 \times 10^{-6}/°$ C., a layer of a leadfree solder material on a region of the electrically conductive structure, and a connection element on the layer of solder material, wherein the connection element has a second coefficient of thermal expansion from $10\times10^{-6}/°C$ to $13\times10^{-6}/°C$, the connection element contains at least 50 wt.-% to 89.5 wt.-% iron, 16 wt.-% to 20 wt.-% chromium, and one or more selected form the group of carbon, nickel, manganese, molybdenum, and titanium, the difference between the first coefficient of thermal expansion of the substrate and the second coefficient of thermal expansion of the connection element is less than $5\times10^{-6}/°C$, the connection element contains a first and a second foot region, a first and a second transition region, and a bridge region between the first and the second transition region, wherein the first and second foot region, the first and second transition region and the bridge region have a same width, a first and a second contact surface are located on a bottom of the first and the second foot region, the first and second contact surface and surfaces of the first and the second transition region facing the substrate are directly connected to the electrically conductive structure by the layer of solder material, wherein the surface of the first transition region facing the substrate directly adjoins the first contact surface and the surface of the second transition region facing the substrate directly adjoins the second contact surface, an angle between a surface of the substrate and each tangent plane of the surfaces of the first and the second transition regions facing the substrate is greater than 0° and less than 90°, and a cavity that is delimited by the electrically conductive structure, the transition regions, and the bridge region is completely or not completely filled with solder material.

20. The method according to claim 19, wherein the connection element has a second coefficient of thermal expansion from $10\times10^{-6}/°C$ to $11.5\times10^{-6}/°C$.

\* \* \* \* \*